(12) United States Patent
Hirler et al.

(10) Patent No.: US 8,362,551 B2
(45) Date of Patent: Jan. 29, 2013

(54) SEMICONDUCTOR DEVICE

(75) Inventors: Franz Hirler, Isen (DE); Walter Rieger, Arnoldstein (AT); Andrew Wood, Villach-Landskron (AT); Mathias Born, Unterfoehring (DE); Ralf Siemieniec, Villach (AT); Jan Ropohl, Regensburg (DE); Martin Poelzl, Ossiach (AT); Oliver Blank, Freising (DE); Uli Hiller, Bad Abbach (DE); Oliver Haeberlein, Villach (AT); Rudolf Zelsacher, Klagenfurt (AT); Maximilian Roesch, Villach-St. Ulrich (AT); Joachim Krumrey, Goedersdorf (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/270,253

(22) Filed: Oct. 11, 2011

(65) Prior Publication Data

US 2012/0025303 A1 Feb. 2, 2012

Related U.S. Application Data

(63) Continuation of application No. 12/268,182, filed on Nov. 10, 2008, now Pat. No. 8,044,459.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ........................ 257/330; 438/272

(58) Field of Classification Search .......... 257/330; 438/272
See application file for complete search history.

(56) References Cited

U.S. PATENT DOCUMENTS

| 3,634,738 | A | * | 1/1972 | Leith et al. ............ 257/597 |
|---|---|---|---|---|
| 4,941,026 | A | | 7/1990 | Temple |
| 5,998,833 | A | | 12/1999 | Baliga |
| 6,461,918 | B1 | | 10/2002 | Calafut |
| 6,534,825 | B2 | | 3/2003 | Calafut |
| 7,098,500 | B2 | | 8/2006 | Zeng |
| 7,253,042 | B2 | | 8/2007 | Disney |
| 7,319,256 | B1 | | 1/2008 | Kraft et al. |
| 7,368,777 | B2 | | 5/2008 | Kocon |
| 7,385,248 | B2 | | 6/2008 | Herrick et al. |
| 7,642,597 | B2 | * | 1/2010 | Saito ..................... 257/341 |
| 7,723,782 | B2 | | 5/2010 | Hirler |
| 7,800,176 | B2 | | 9/2010 | Werner |

(Continued)

FOREIGN PATENT DOCUMENTS

DE 1007415 9/2001
DE 10 2005 041 285 3/2007

OTHER PUBLICATIONS

"A New Generation of High Voltage MOSFETs Breaks the Limit Line of Silicon", Deboy G., et al., IEEE, 2008 (1 pg.). Office Action dated Sep. 28, 2010 in U.S. Appl. No. 12/268,182.

*Primary Examiner* — Phuc Dang
(74) *Attorney, Agent, or Firm* — Dicke, Billig & Czaja, PLLC

(57) ABSTRACT

In one embodiment, a field effect transistor has a semiconductor body, a drift region of a first conductivity type and a gate electrode. At least one trench extends into the drift region. A field plate is arranged at least in a portion of the at least one trench. A dielectric material at least partially surrounds both the gate electrode and the field plate. The field plate includes a first semiconducting material.

22 Claims, 46 Drawing Sheets

U.S. PATENT DOCUMENTS

| | | |
|---|---|---|
| 2002/0190282 A1 | 12/2002 | Calafut |
| 2005/0133858 A1* | 6/2005 | Banerjee et al. ............... 257/327 |
| 2006/0211179 A1* | 9/2006 | Siemieniec et al. .......... 438/138 |
| 2007/0138544 A1* | 6/2007 | Hirler et al. ................... 257/330 |
| 2008/0017920 A1 | 1/2008 | Sapp et al. |
| 2009/0079002 A1* | 3/2009 | Lee et al. ...................... 257/355 |

* cited by examiner

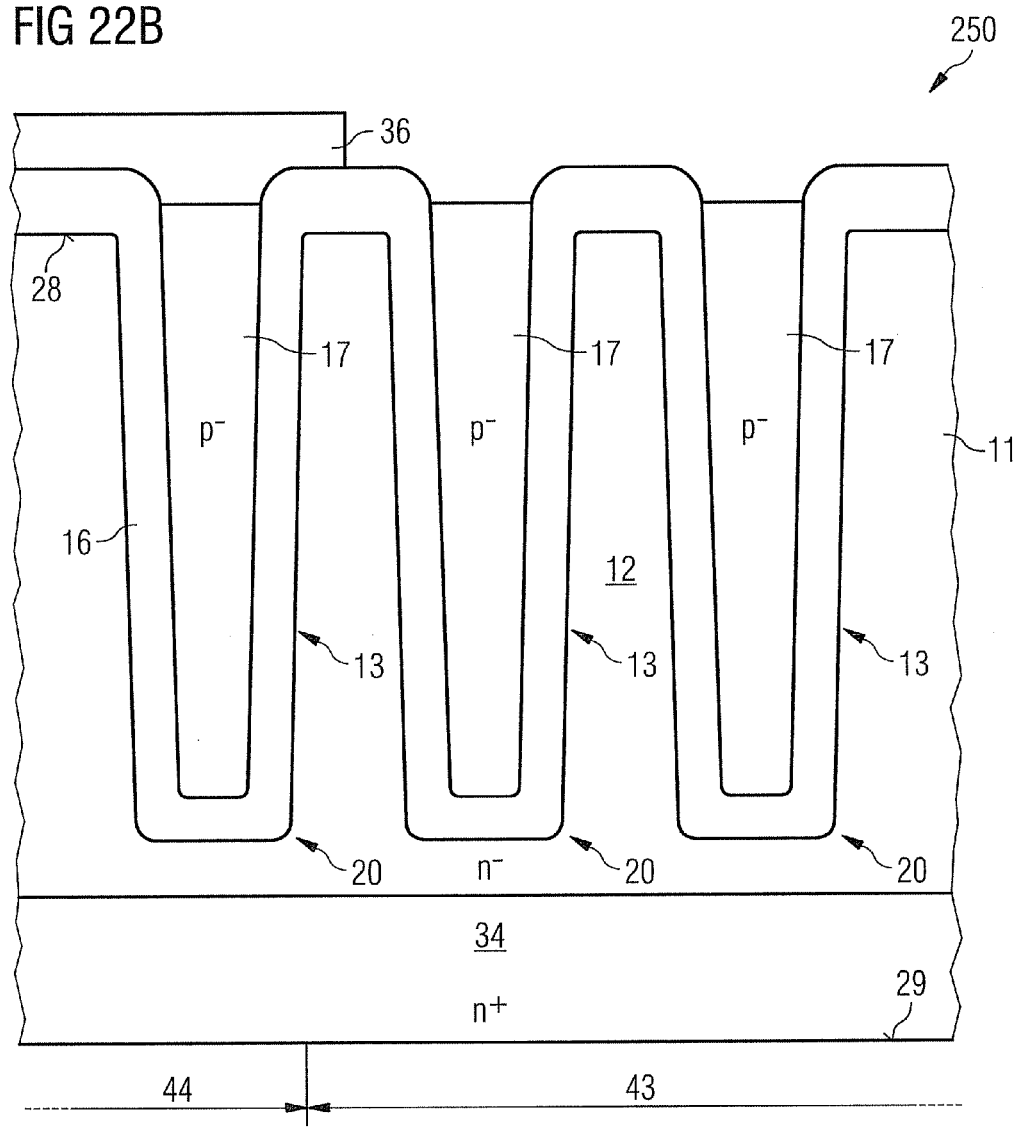

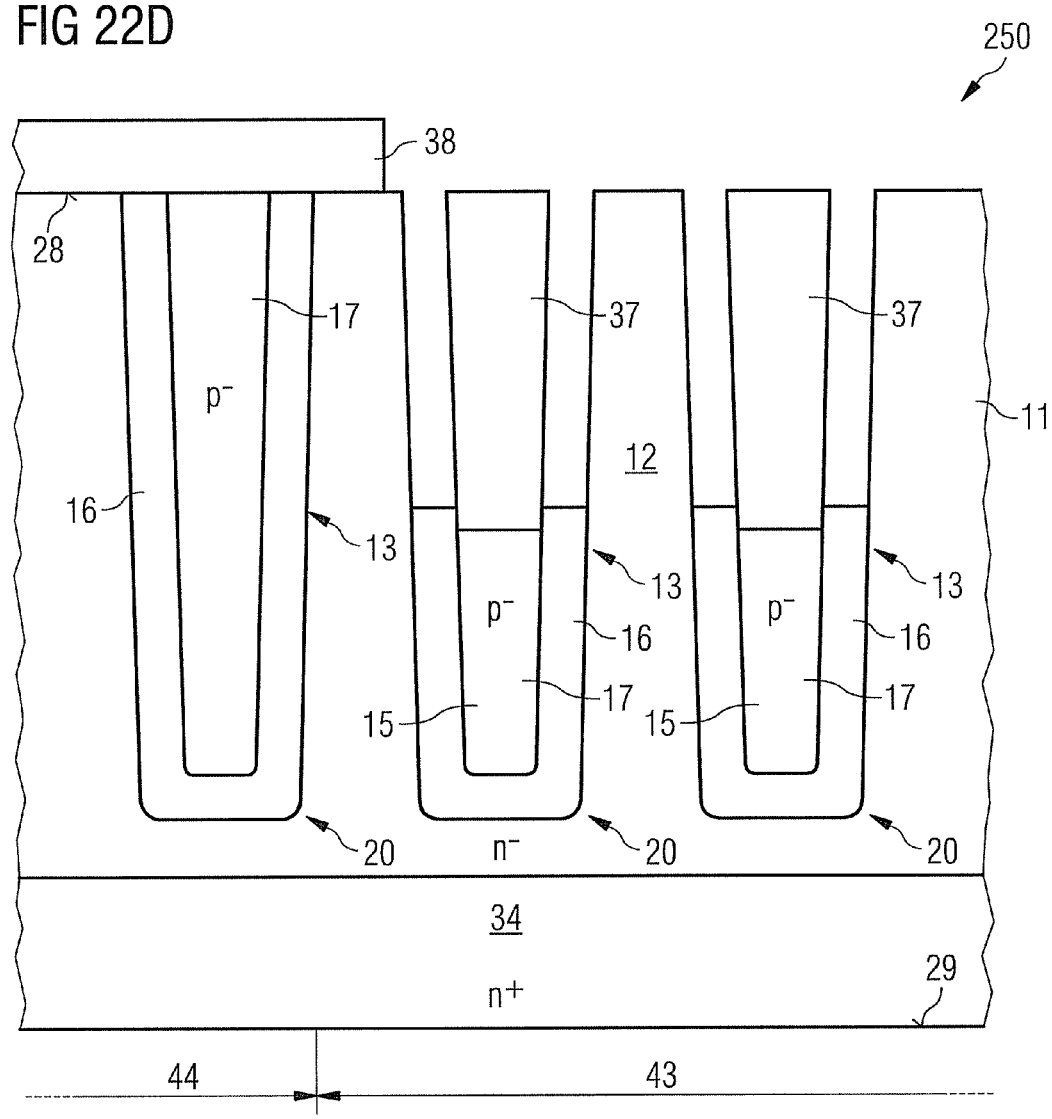

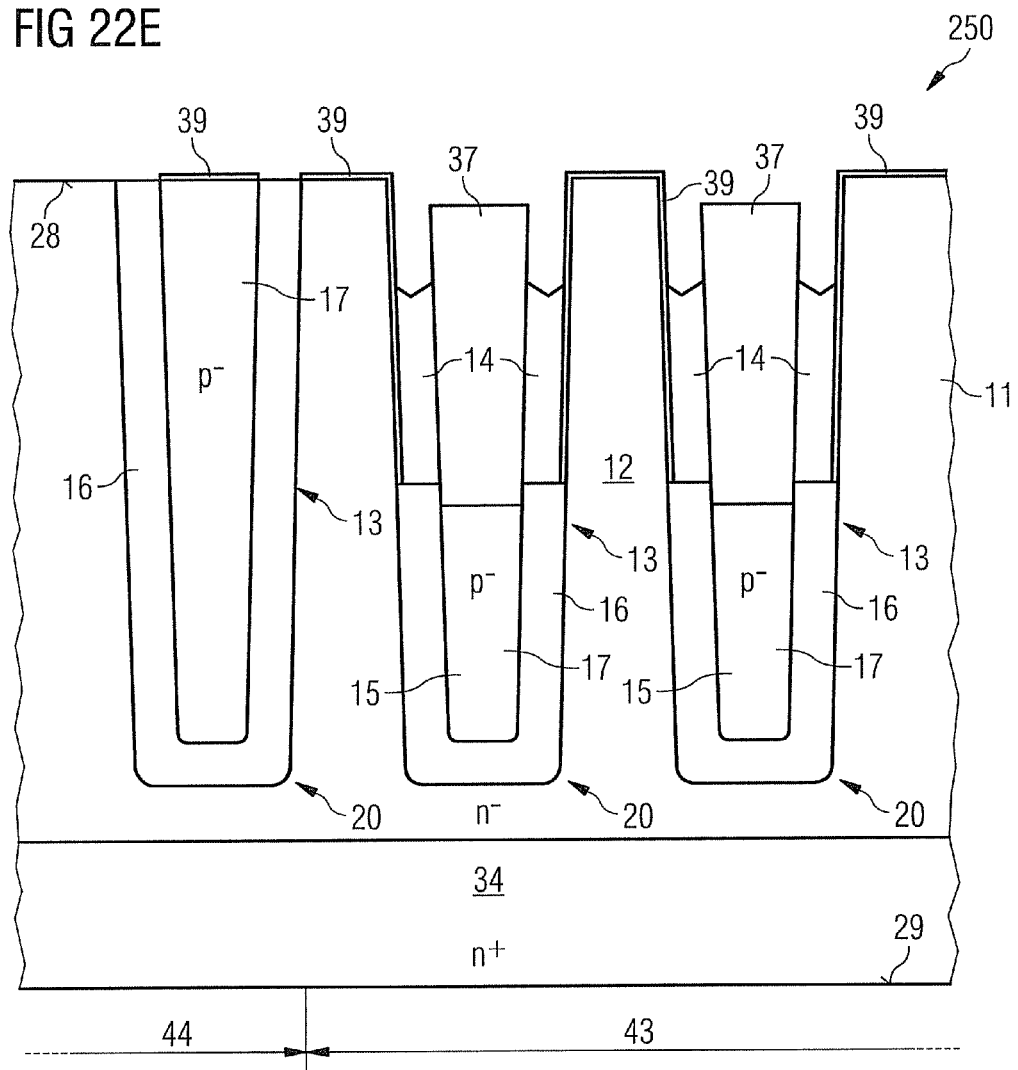

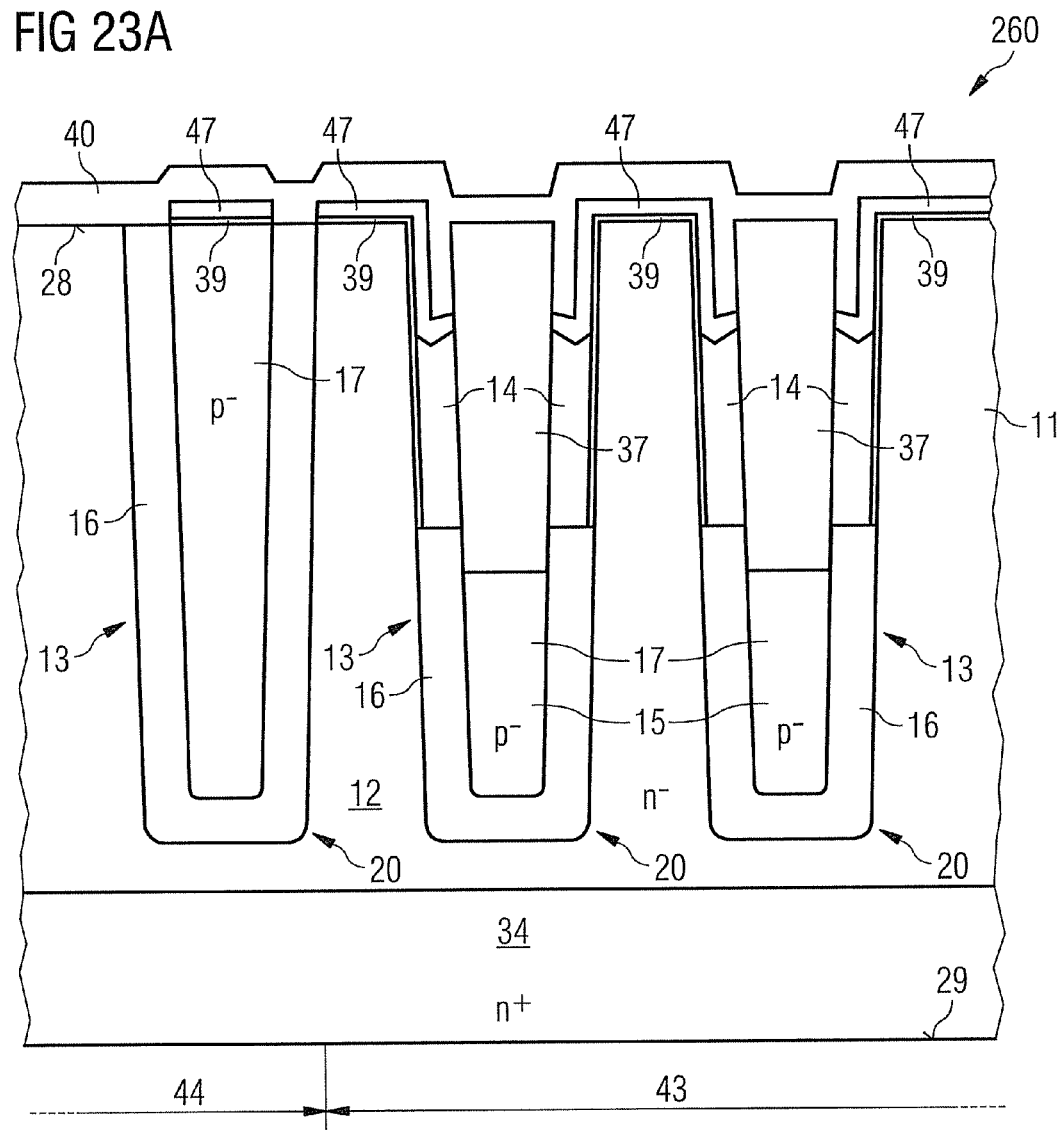

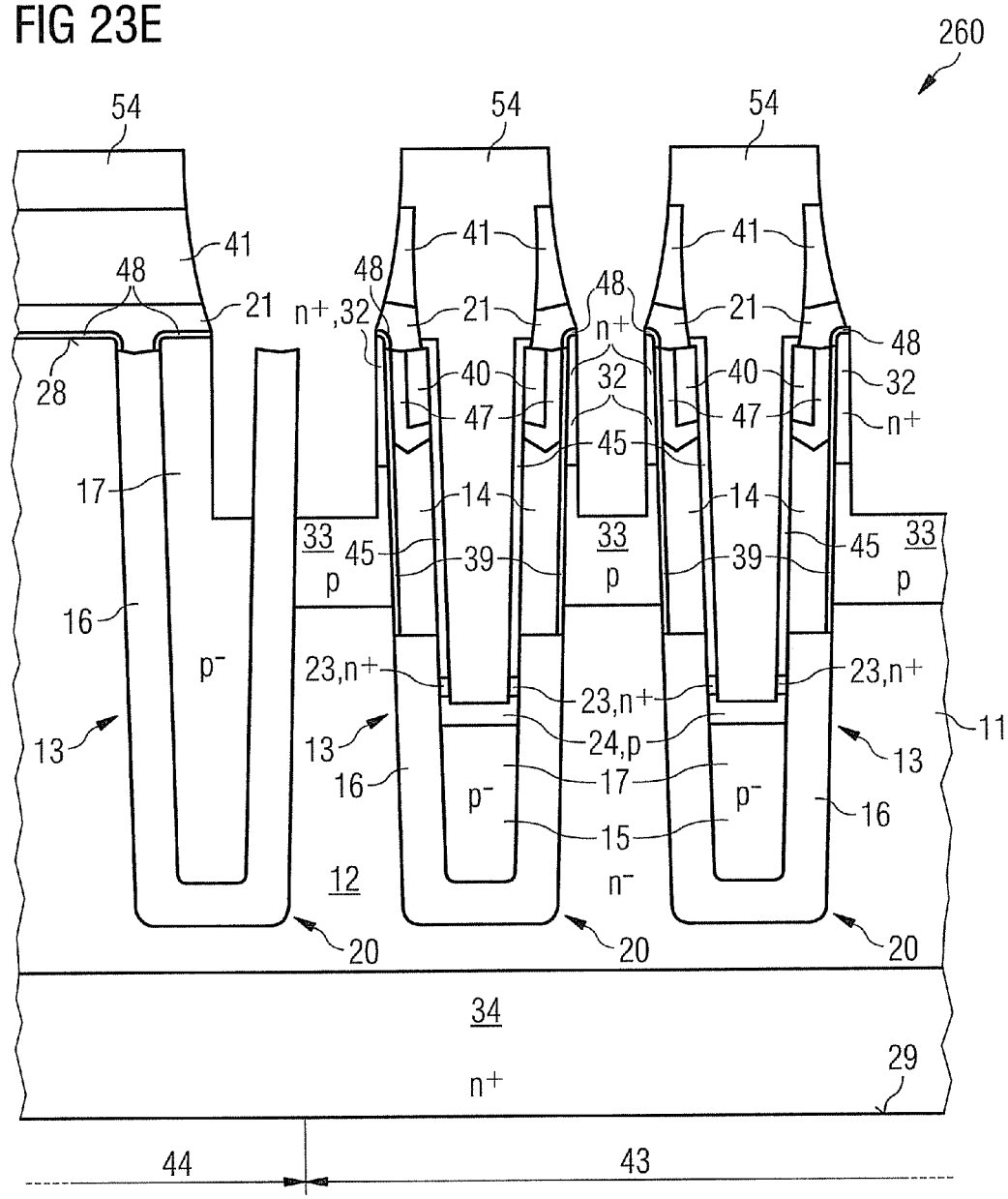

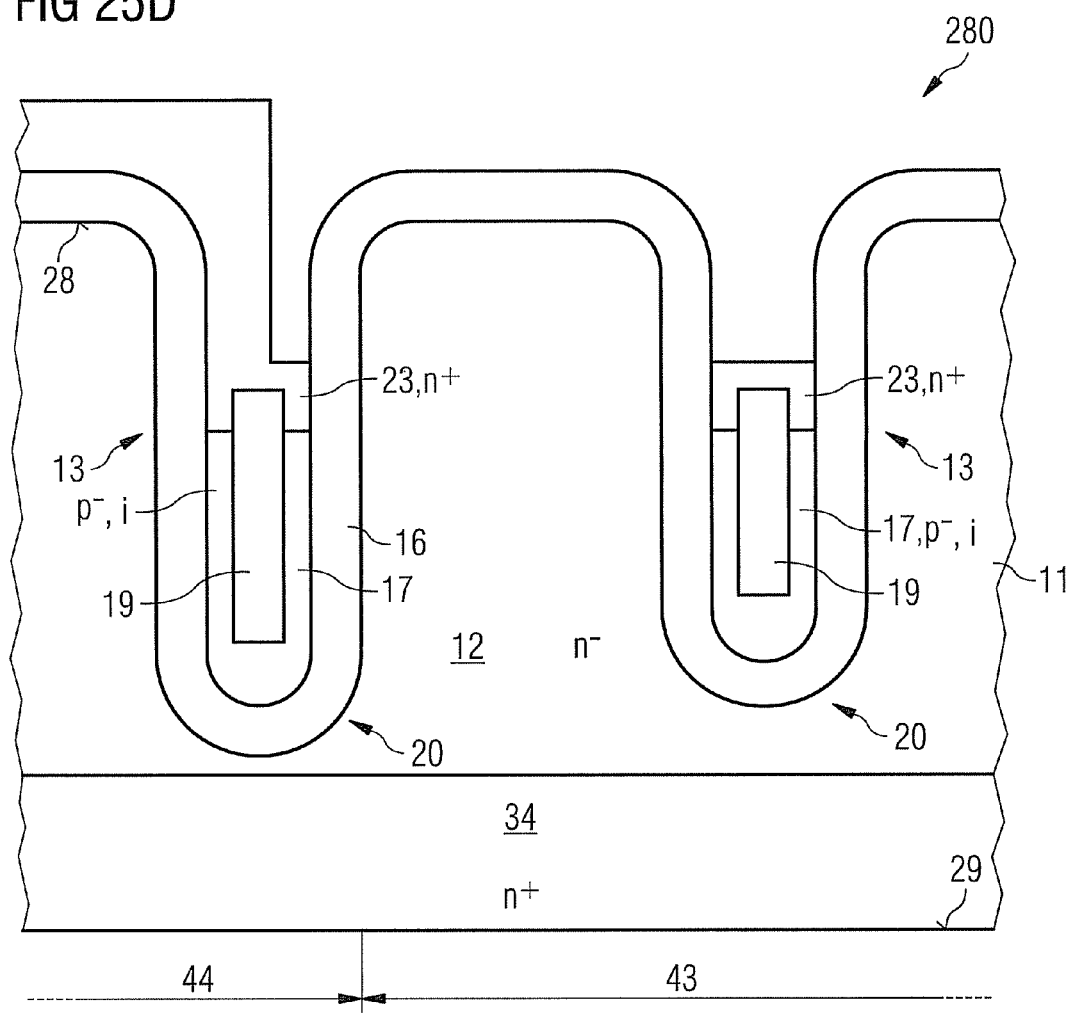

SEMICONDUCTOR DEVICE

CROSS-REFERENCE TO RELATED APPLICATIONS

This Utility Patent application is a continuation application of U.S. application Ser. No. 12/268,182, filed Nov. 10, 2008, now U.S. Pat. No. 8,044,459, which is incorporated herein by reference.

BACKGROUND

In semiconductor devices, for example DMOS-power transistors, a significant reduction of $R_{on} \cdot A$ and switching losses in the Miller phase may be achieved by the introduction of highly conducting field plates. The field plates include for example highly doped polysilicon or a metal. In many applications, the output capacitance $C_{OSS}$ limits the further reduction of losses. The energy stored in $C_{OSS}$ often appears as a loss in other components and also leads to unwanted overshootings in the drain to source voltage of the semiconductor device, for example in power switching applications. The output capacitance includes the drain to source capacitance $C_{DS}$ and the gate to drain capacitance $C_{GD}$. The drain to source capacitance typically is the dominating part of the output capacitance and includes the capacitance of the blocking layer between body zone and drift zone and the capacitance of the dielectric between the field plate and the drift zone in series with the capacitance of the depleted drift zone.

SUMMARY

In one embodiment, a field effect transistor includes a semiconductor body, a drift region of a first conductivity type and a gate electrode. At least one trench extends into the drift region. A field plate is arranged at least in a portion of the at least one trench. A dielectric material at least partially surrounds both the gate electrode and the field plate. The field plate includes a first semiconducting material.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 22A to 22J illustrate a method for the production of a field effect transistor.

FIGS. 23A to 23F illustrate a method for the production of a field effect transistor.

FIGS. 25A to 25E illustrate a method for the production of a field effect transistor.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
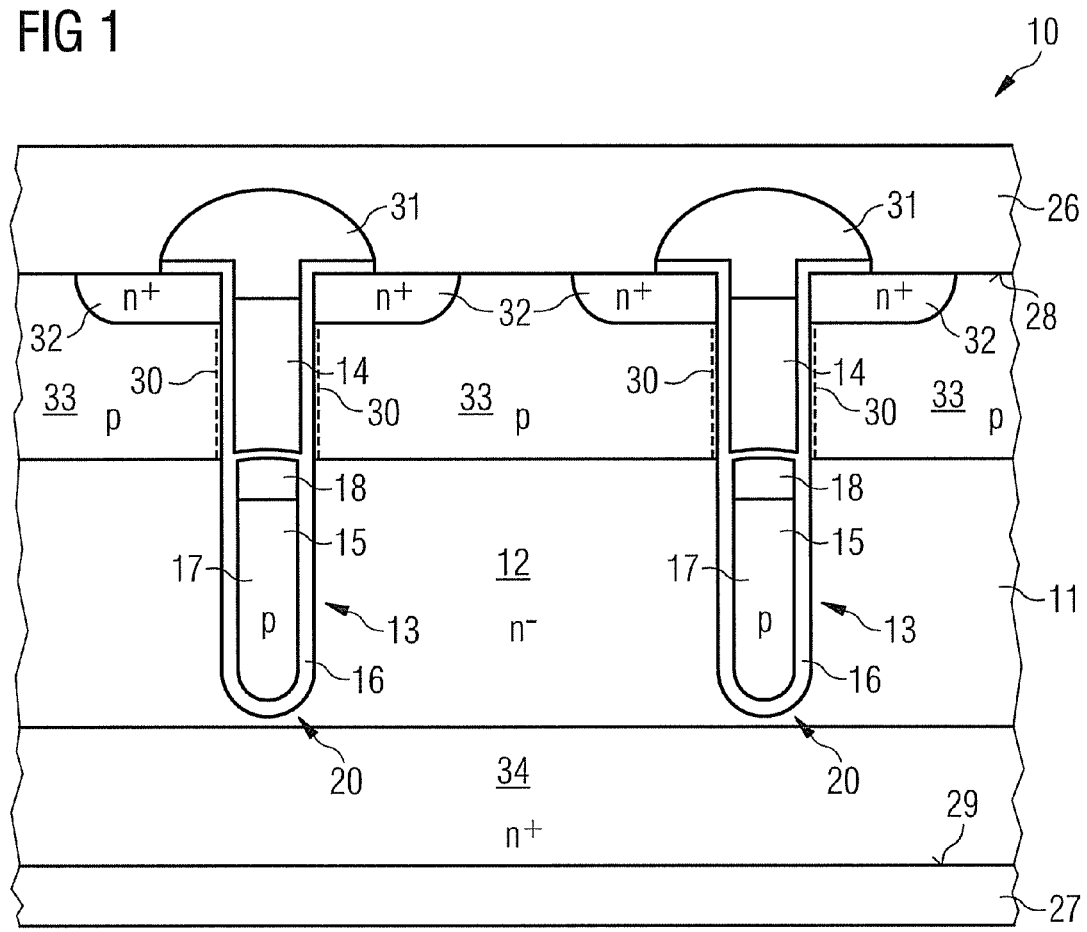
FIG. 1 illustrates a diagrammatic cross-section through a section of a field effect transistor.

FIG. 1 illustrates a diagrammatic cross-section through a section of a field effect transistor 10. In this embodiment, the field effect transistor 10 has a semiconductor body 11 with a first surface 28, which in the illustrated embodiment represents a front-sided surface of the semiconductor body 11, and with a second surface 29 opposite the first surface 28, which in the illustrated embodiment represents a back-sided surface of the semiconductor body 11. The field effect transistor 10 includes a first electrode 26, a second electrode 27 and a gate electrode 14. The gate electrode 14 is designed to form a conductive channel region 30 indicated by a broken line. By applying a suitable voltage to the gate electrode 14 and the associated formation of the conductive channel region 30, the field effect transistor 10 can be switched from a non-conducting state to a conducting state. For this purpose, the gate electrode 14 contains an electrically conductive material, such as a metal or highly doped polysilicon. The first electrode 26 is located on the first surface 28 of the semiconductor body 11 and contains an electrically conductive material, typically a metal. Towards the first surface 28, the first electrode 26 is adjoined by an insulating region 31, which electrically insulates the first electrode 26 from the gate electrode 14. The insulating region 31 may for example include an oxide. The second electrode 27 is located on the second surface 29 of the semiconductor body 11 and contains an electrically conductive material, typically a metal.

In the illustrated embodiment, the field effect transistor 10 provides a semiconductor device structure for at least one n-channel MOSFET. For this purpose, an $n^+$-doped region 32 providing a source region is arranged in a near-surface region of the first surface 28. The $n^+$-doped region 32 is adjoined in the vertical direction towards the second surface 29 by a p-doped body zone 33. The first electrode 26, which in the illustrated embodiment is a source electrode, electrically contacts both the body zone 33 and the source region. In a non-illustrated embodiment, the body zone 33 may be floating.

In the vertical direction towards the second surface 29, the body zone 33 is adjoined by an $n^-$-doped drift region 12. An $n^+$-doped region 34 in a near-surface region of the second surface 29 provides a drain region. The drain region is electrically contacted to the second electrode 27, the latter being a drain electrode in the illustrated embodiment.

Moreover, in the illustrated embodiment, the gate electrode 14 is a trench gate electrode. For this purpose at least one trench 13 is provided in the semiconductor body 11. The gate electrode 14 is arranged in an upper portion of the trench 13. Additionally, a field plate 15 is arranged in a lower portion of the trench 13. The trench walls and the trench base 20 are covered by a dielectric material 16. The dielectric material 16 at least partially surrounds the gate electrode 14 and the field plate 15 and electrically insulates the gate electrode 14 and the field plate 15 both from the semiconductor body 11 and from each other. The dielectric material 16 may for example include an oxide. The thickness of the dielectric material 16 adjacent the field plate 15 may be chosen to be different from the thickness of the dielectric material 16 adjacent the gate electrode 14.

By providing the field plate 15, in particular the vertically integrated charge carrier concentration in the drift region 12 may be equal to or higher than the breakdown charge of the semiconductor body 11.

The field plate 15 includes a first semiconducting material 17. In the illustrated embodiment, the first semiconducting material 17 may be of p-type conductivity and thus is of the complementary type of conductivity with respect to the conductivity type of the drift region 12. The first semiconducting material 17 may be weakly doped and highly resistive and includes for example lightly doped polysilicon, amorphous silicon or mono crystalline silicon.

In the illustrated embodiment, the first semiconducting material 17 has a constant doping concentration N. The doping concentration N may be equal to or less than $5 \cdot 10^{17}$ cm$^{-3}$. Moreover, the doping concentration N may be equal to or less than $2 \sim 10^{16}$ cm$^{-3}$.

Additionally, a contact region 18 is arranged in the trench 13 and adjacent to the field plate 15. The contact region 18 is electrically coupled to the first electrode 26 and provides an electrical coupling of the field plate 15 to the first electrode 26.

The contact region 18 may contain highly doped polysilicon or a silicide. Moreover, the contact region 18 may contain a metal. Thus, the contact region 18 has a low resistance and thereby may reduce the feedback of the drain potential to the gate electrode 14.

In the illustrated embodiment, the contact region 18 is arranged between the gate electrode 14 and the field plate 15. In a non-illustrated embodiment, the contact region 18 may be arranged at a vertically different position adjacent to the field plate 15.

Silicon is typically provided as a material for the semiconductor body 11. In addition, silicon carbide or a material from a III/V semiconductor, such as GaAs or GaN, may be provided.

When the field effect transistor 10 is reverse-biased at low drain to source voltages, the depletion zone may extend into the field plate 15 and may deplete at least a part of the first semiconducting material 17, thereby providing an additional depletion zone capacitance in the field plate 15 in series with the dielectric capacitance between the field plate 15 and the drift region 12, which leads to a reduced drain to source capacitance. As explained above, a reduction of the drain to source capacitance provides a reduction of the output capacitance and thus may lead to reduced switching losses and switching times of the field effect transistor 10. For increasing drain to source voltages, the depletion of the field plate 15 should be avoided in order to provide the field plate effect on the drift region 12. Therefore, at high drain to source voltages, the formation of an n-channel at an interface to the dielectric material 16 may be provided. The n-channel may prevent the field plate 15 from carrying high voltages. Thereby, the field effect transistor 10 may attain a high blocking voltage.

In addition to the illustrated semiconductor device structure for at least one n-channel MOSFET, in a non-illustrated embodiment the field effect transistor 10 has a semiconductor device structure for at least one p-channel MOSFET. In this case, the doping of the individual regions of the p-channel MOSFET complements the doping of the corresponding regions of the n-channel MOSFET.

In a further non-illustrated embodiment, the field effect transistor 10 has a semiconductor device structure for at least one IGBT, which may be an n-channel IGBT or a p-channel IGBT.

In the illustrated embodiment, the drain electrode, i.e., the second electrode 27, is arranged on the second surface 29 of the semiconductor body 11. In a non-illustrated embodiment, both the source electrode, i.e., the first electrode 26, and the drain electrode are arranged on the first surface 28 of the semiconductor body 11, thereby providing a drain up structure.

Figure 2:
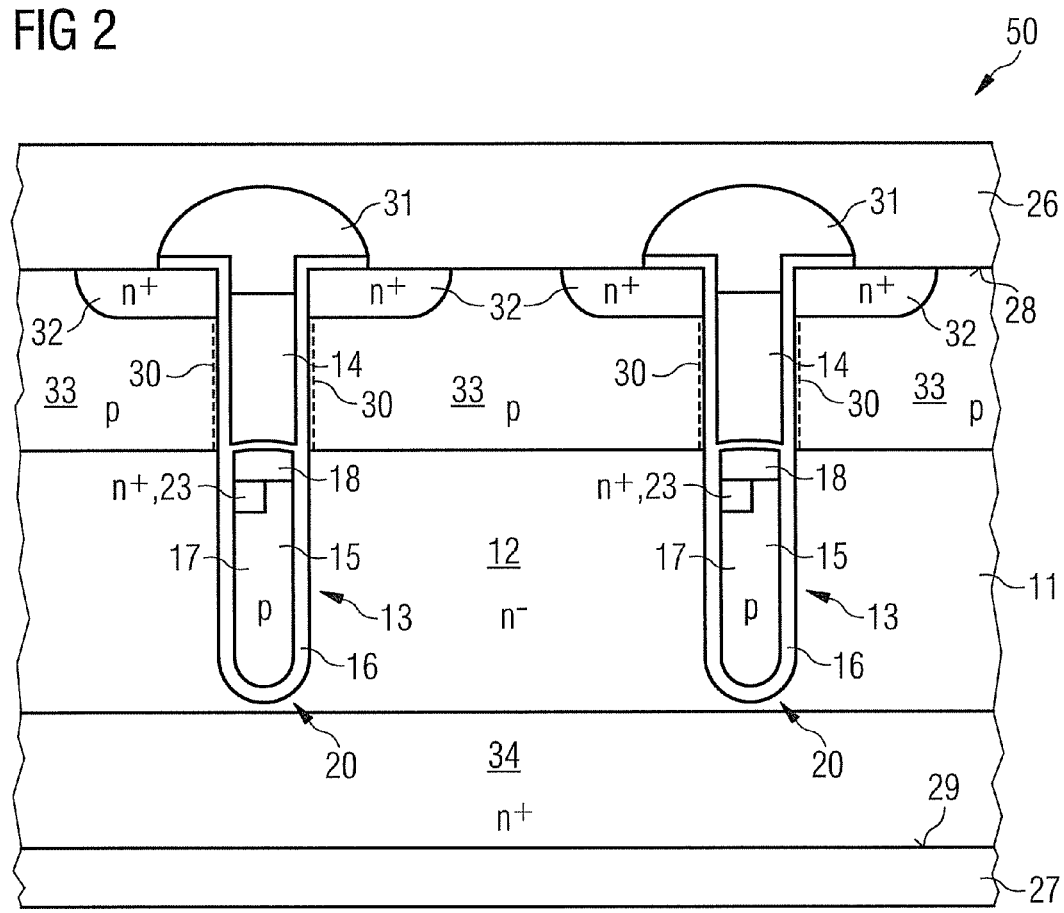
FIG. 2 illustrates a diagrammatic cross-section through a section of a field effect transistor.

FIG. 2 illustrates a diagrammatic cross-section through a section of a field effect transistor 50. Components of the same function as those in FIG. 1 are identified by the same reference numbers and are not explained again below.

The field effect transistor 50 differs from the field effect transistor 10 in that a second semiconducting material 23 is arranged in the trench 13 adjacent to the contact region 18 and at least partially between the contact region 18 and the first semiconducting material 17. In the illustrated embodiment, the second semiconducting material 23 is $n^+$-conducting and thus has the same conductivity type as the drift region 12. The second semiconducting material 23 may for example contain highly doped polysilicon.

The field effect transistor 50 may have a reduced switching time with respect to the field effect transistor 10 illustrated in FIG. 1, since for the latter, the electrons for the n-channel at high drain to source voltages are provided by generation, whereas for the field effect transistor 50, the electrons are provided by the second semiconducting material 23 being coupled to the contact region 18.

Figure 3:
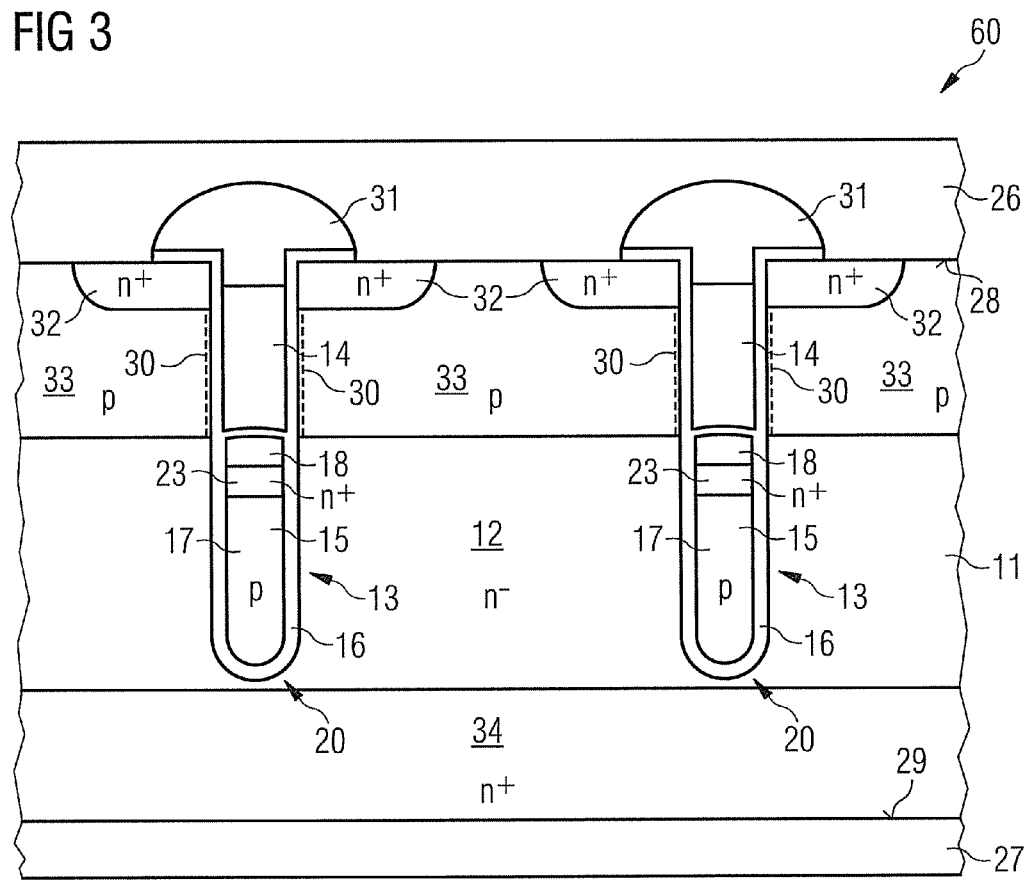
FIG. 3 illustrates a diagrammatic cross-section through a section of a field effect transistor.

FIG. 3 illustrates a diagrammatic cross-section through a section of a field effect transistor 60. Components of the same function as those in the previous figures are identified by the same reference numbers and are not explained again below.

The field effect transistor 60 differs from the field effect transistor 50 in that the second semiconducting material 23 is arranged completely between the contact region 18 and the field plate 15. Thus, the field plate 15 is not connected to the contact region 18, but is floating.

The switching characteristics of the field effect transistor 50 listed above, provided by the second semiconducting material 23, are also exhibited by the field effect transistor 60 and are not listed again to avoid repetition.

Figure 4:
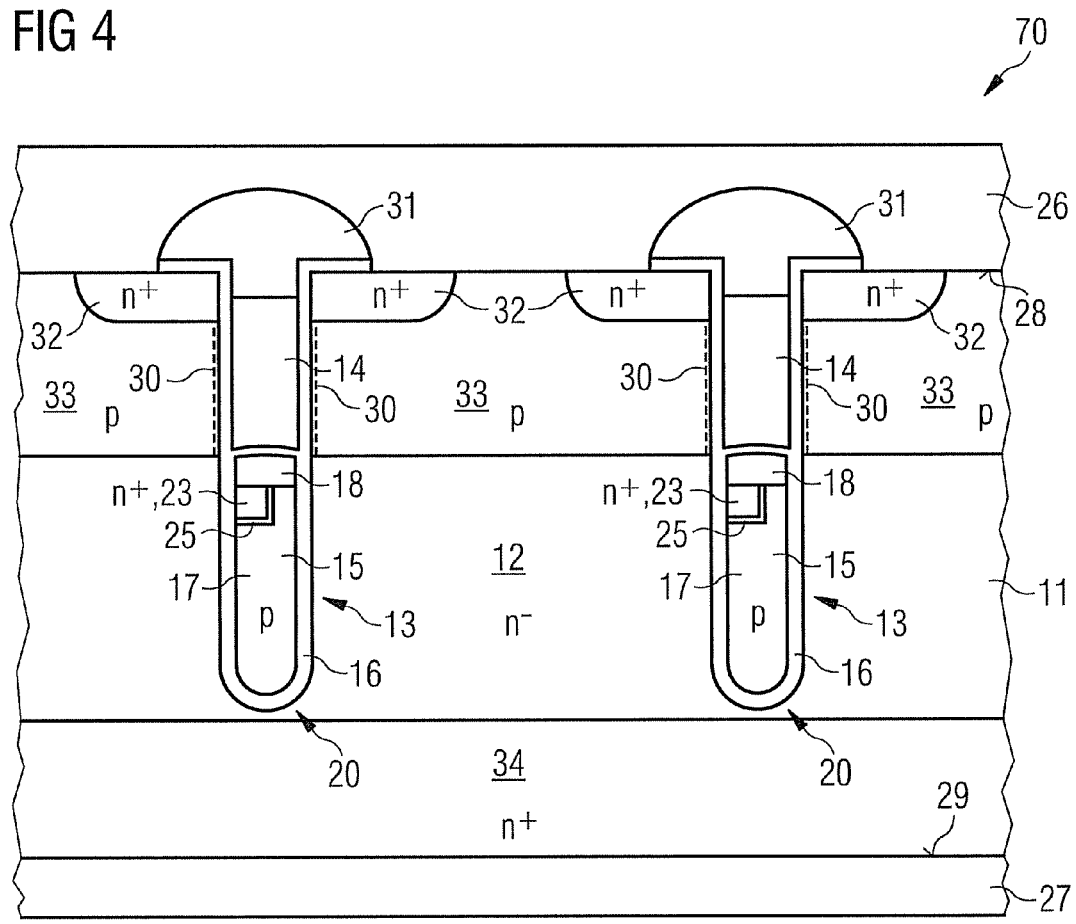
FIG. 4 illustrates a diagrammatic cross-section through a section of a field effect transistor.

FIG. 4 illustrates a diagrammatic cross-section through a section of a field effect transistor 70. Components of the same function as those in the previous figures are identified by the same reference numbers and are not explained again below.

In the illustrated embodiment, a diffusion barrier layer 25 is arranged at least partially between the first semiconducting material 17 and the second semiconducting material 23.

Since the diffusion coefficient for dopants in polysilicon is significantly higher than the diffusion coefficient in monocrystalline silicon, providing the diffusion barrier layer 25 may reduce or omit the diffusion of dopants from one semiconducting material to the other. The diffusion barrier layer 25 may contain an oxide, which may be as thin as a fraction of a monolayer. Moreover, the diffusion barrier layer 25 may contain a nitride, for example SiN.

In the illustrated embodiment, the first semiconducting material 17 is connected to the contact region 18.

Figure 5:
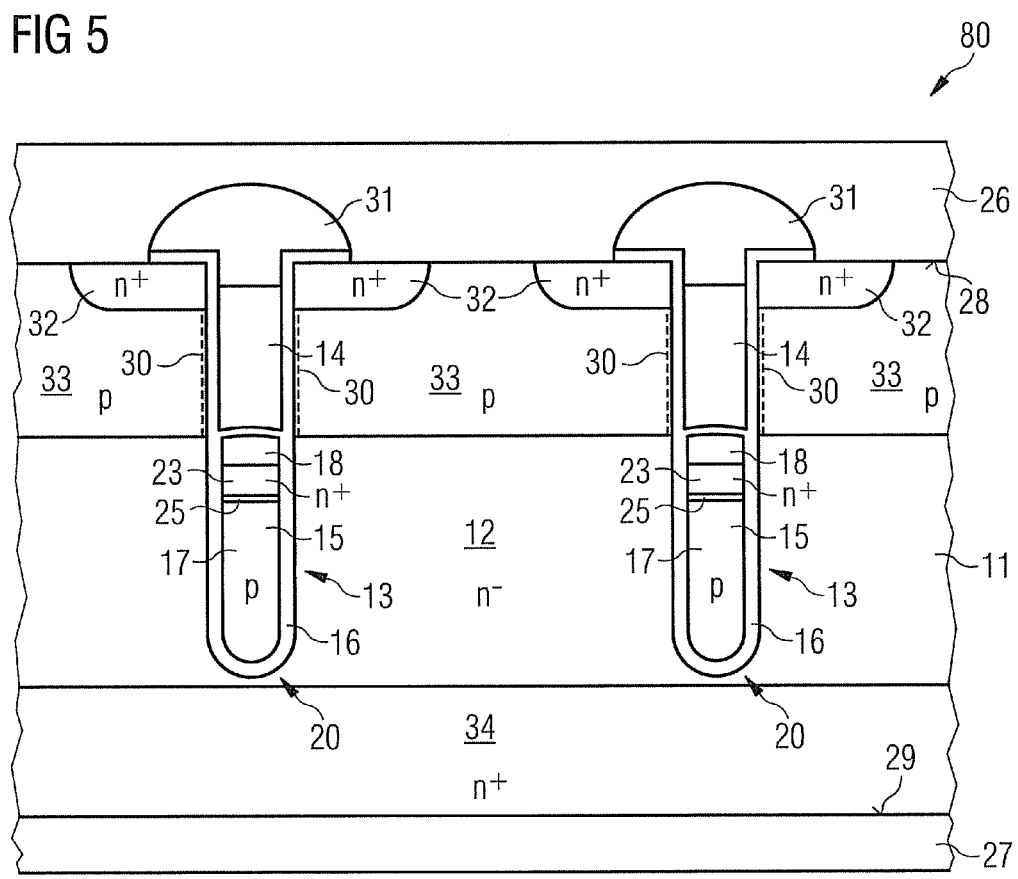
FIG. 5 illustrates a diagrammatic cross-section through a section of a field effect transistor.

FIG. 5 illustrates a diagrammatic cross-section through a section of a field effect transistor 80. Components of the same function as those in the previous figures are identified by the same reference numbers and are not explained again below.

In the illustrated embodiment, the field effect transistor 80 includes a diffusion barrier layer 25 being arranged at least partially between the first semiconducting material 17 and the second semiconducting material 23. The diffusion barrier layer 25 may include the same materials as the diffusion barrier layer 25 of the field effect transistor 70 illustrated in FIG. 4.

The field effect transistor 80 differs from the field effect transistor 70 in that the first semiconducting material 17 is not connected to the contact region 18, but is floating.

Figure 6:
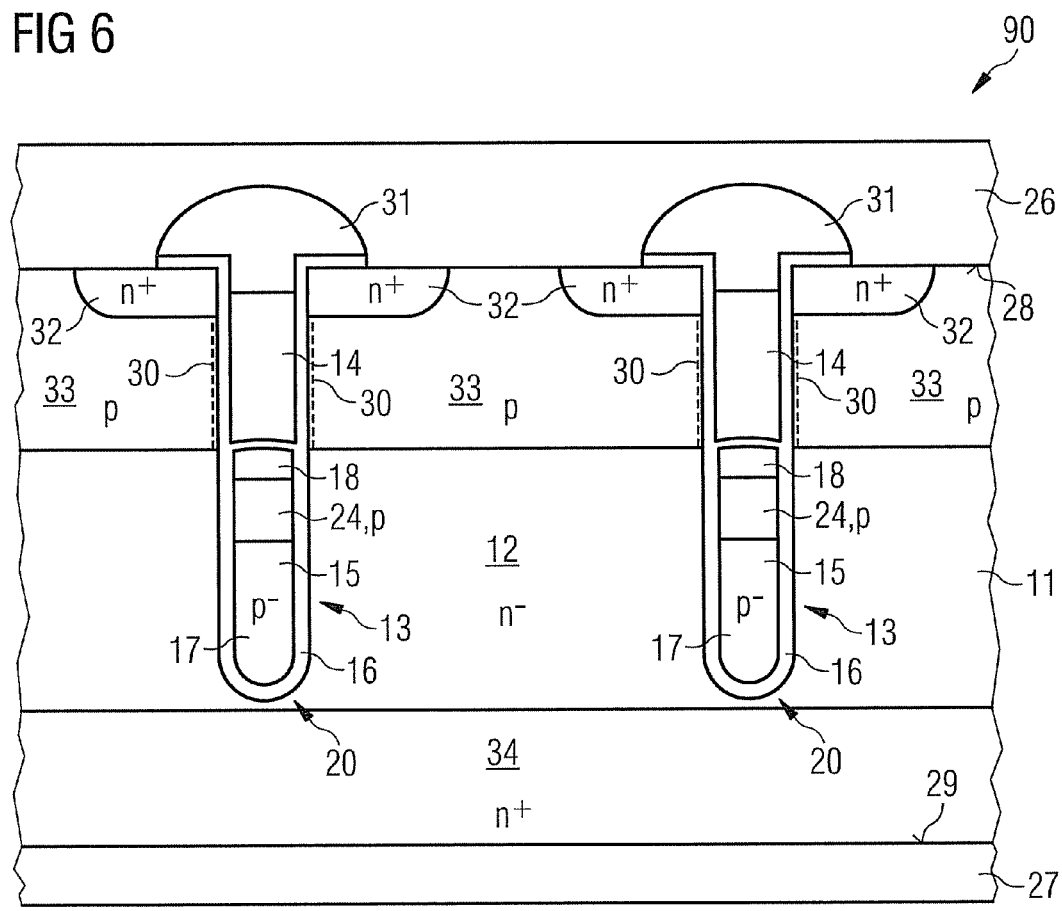
FIG. 6 illustrates a diagrammatic cross-section through a section of a field effect transistor.

FIG. 6 illustrates a diagrammatic cross-section through a section of a field effect transistor 90. Components of the same function as those in the previous figures are identified by the same reference numbers and are not explained again below.

In the illustrated embodiment, the first semiconducting material 17 has a variable doping concentration in a vertical direction towards the base 20 of the trench 13. For that purpose, in a region 24, which is adjacent to the contact region 18, the first semiconducting material 17 is p-doped, whereas in the remaining part, the first semiconducting material 17 is p$^-$-doped, thereby providing a stepped graded doping concentration in the vertical direction.

The doping concentration in the region 24 may be selected according to a desired voltage for the onset of the formation of the n-channel at the interface between the field plate 15 and the dielectric material 16. The remaining part of the field plate 15, which is lower doped than the region 24, provides the formation of the depletion zone in the field plate 15.

In a non-illustrated embodiment, the region 24 may contain a semiconducting material which is different from the first semiconducting material 17 and which has a doping concentration higher than the doping concentration of the first semiconducting material 17.

In a further non-illustrated embodiment, the doping concentration of the first semiconducting material 17 may be linearly or otherwise graded in the vertical direction towards the base 20 of the trench 13. Furthermore, the first semiconducting material 17 may have a Gaussian doping profile in the vertical direction towards the base 20. For the embodiments described above, in some examples the doping concentration of the first semiconducting material 17 decreases with increasing distance to the first surface 28 of the semiconductor body 11.

Figure 7:
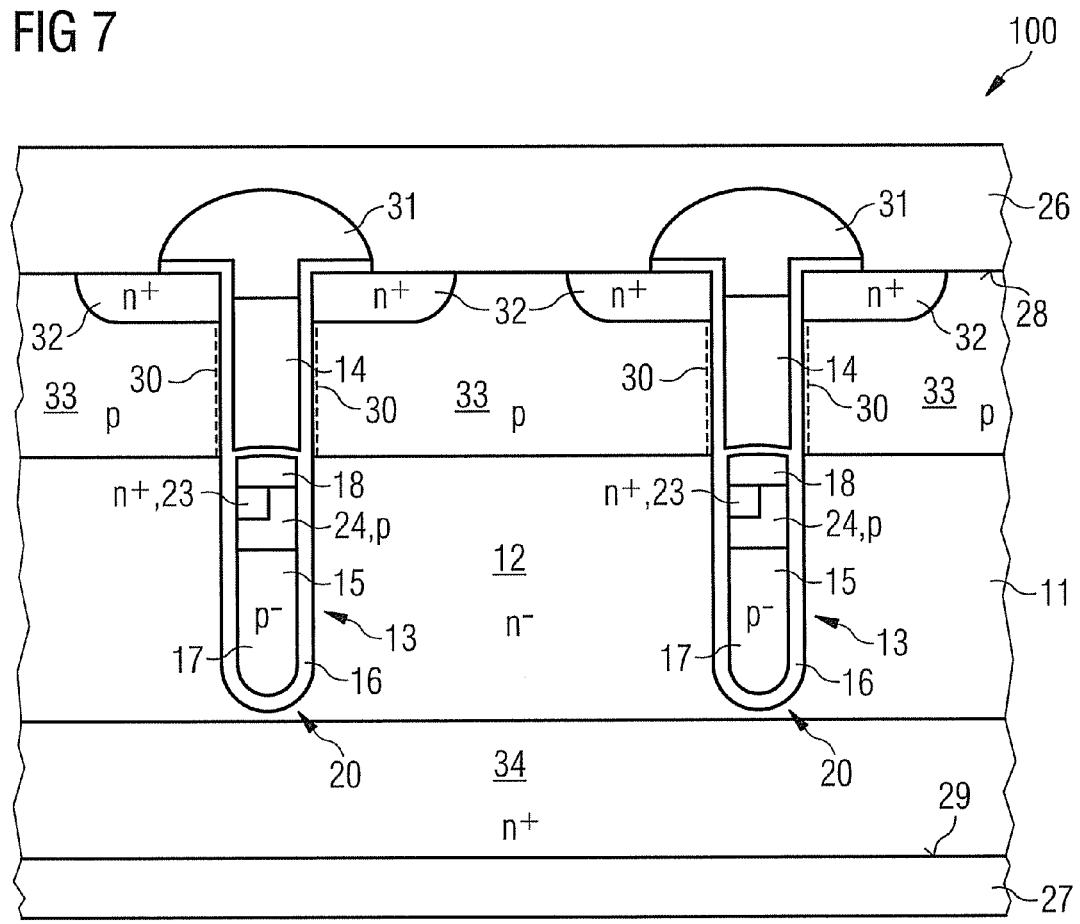
FIG. 7 illustrates a diagrammatic cross-section through a section of a field effect transistor.

FIG. 7 illustrates a diagrammatic cross-section through a section of a field effect transistor 100. Components of the same function as those in the previous figures are identified by the same reference numbers and are not explained again below.

The field effect transistor 100 differs from the field effect transistor 90 illustrated in FIG. 6 in that a second, n$^+$-doped semiconducting material 23 is at least partially arranged between the contact region 18 and the region 24 of the first semiconducting material 17, which is higher doped than the rest of the first semiconducting material 17 and which is arranged adjacent to the contact region 18. The field effect transistor 100 has similar switching characteristics as the field effect transistor 50 illustrated in FIG. 2, which will not be listed again to avoid repetition.

Figure 8:
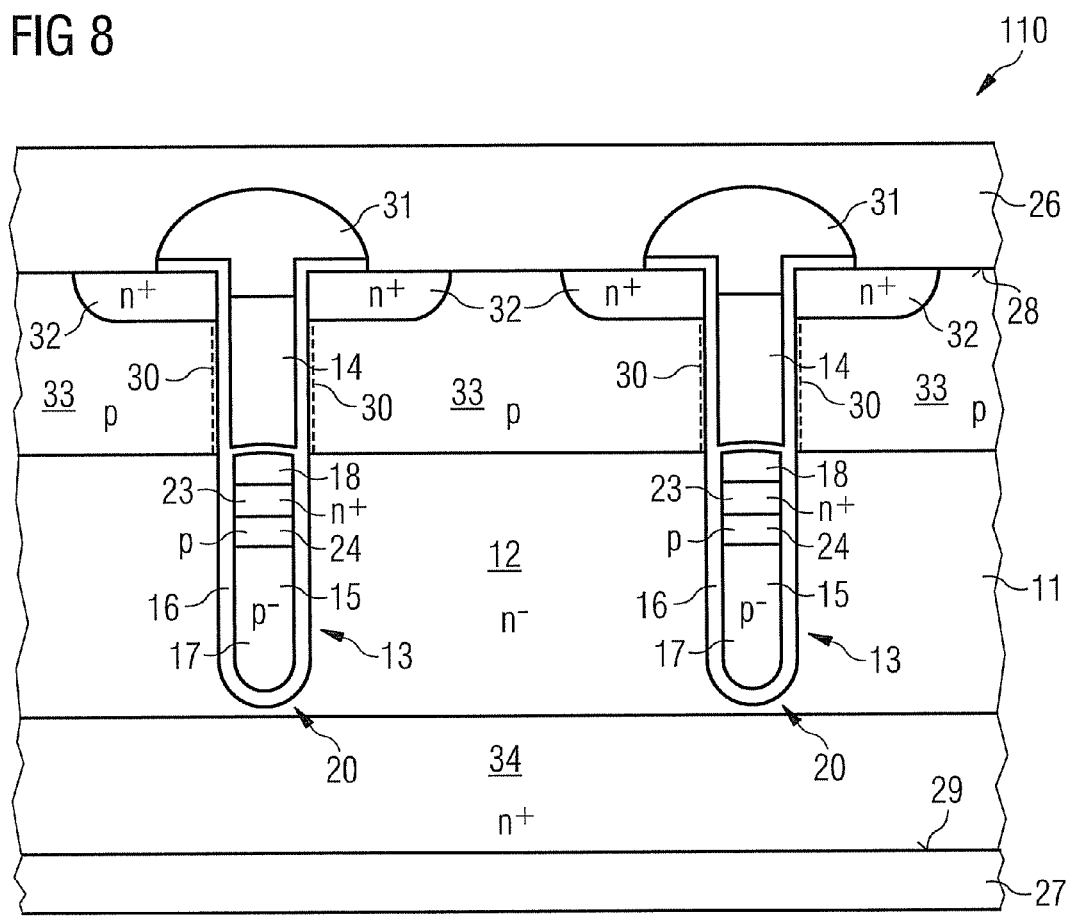
FIG. 8 illustrates a diagrammatic cross-section through a section of a field effect transistor.

FIG. 8 illustrates a diagrammatic cross-section through a section of a field effect transistor 110. Components of the same function as those in the previous figures are identified by the same reference numbers and are not explained again below.

The field effect transistor 110 differs from the field effect transistor 100 illustrated in FIG. 7 in that the first semiconducting material 17 is not connected to the contact region 18, but is floating.

The switching characteristics of the field effect transistor 110 are similar to those of the field effect transistor 100 illustrated in FIG. 7 and therefore are not listed again to avoid repetition.

Figure 9:
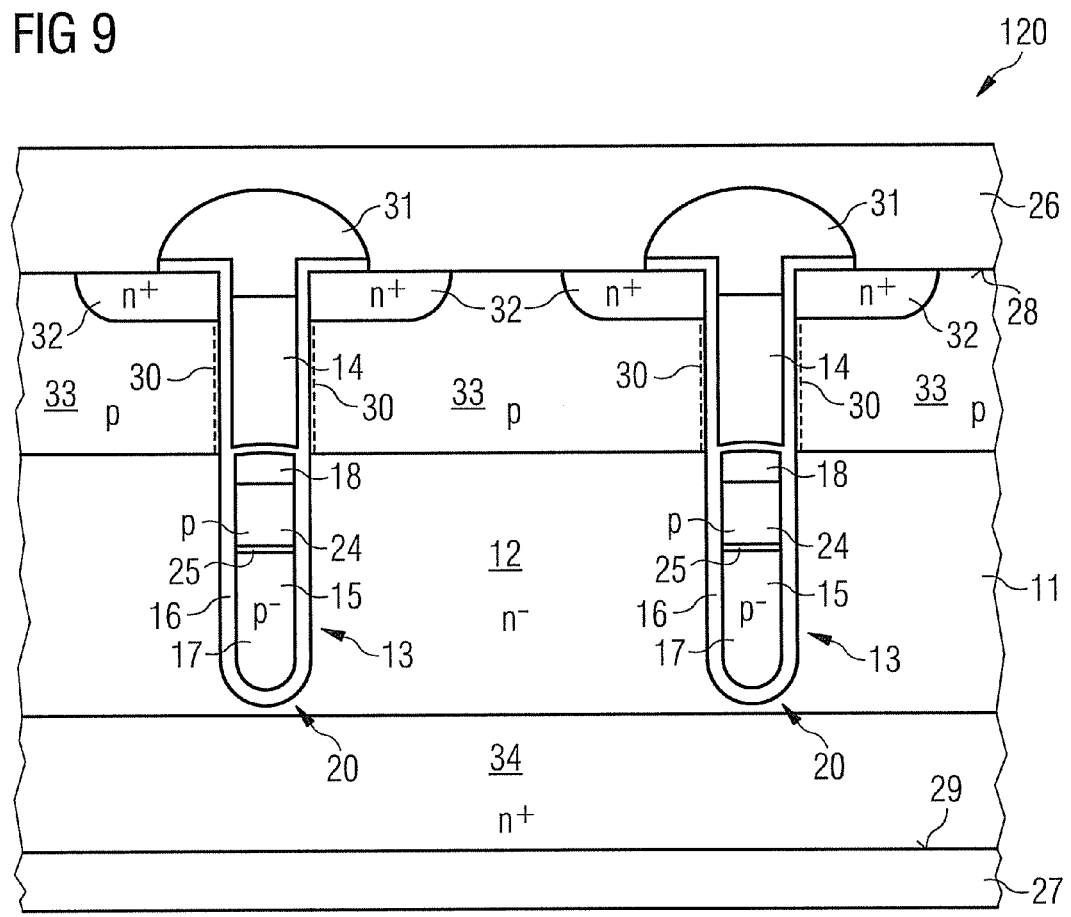
FIG. 9 illustrates a diagrammatic cross-section through a section of a field effect transistor.

FIG. 9 illustrates a diagrammatic cross-section through a section of a field effect transistor 120. Components of the same function as those in the previous figures are identified by the same reference numbers and are not explained again below.

In the illustrated embodiment, a diffusion barrier layer 25 is arranged at least partially between the region 24 and the rest of the first semiconducting material 17, which is lower doped than the region 24. The material of the diffusion barrier layer 25 may be the same as the material of the diffusion barrier layer 25 for the field effect transistor 70 illustrated in FIG. 4.

Providing the diffusion barrier layer 25 may reduce or omit the diffusion of dopants from one semiconducting material to the other, as already discussed above in connection with the field effect transistor 70 illustrated in FIG. 4.

Figure 10:
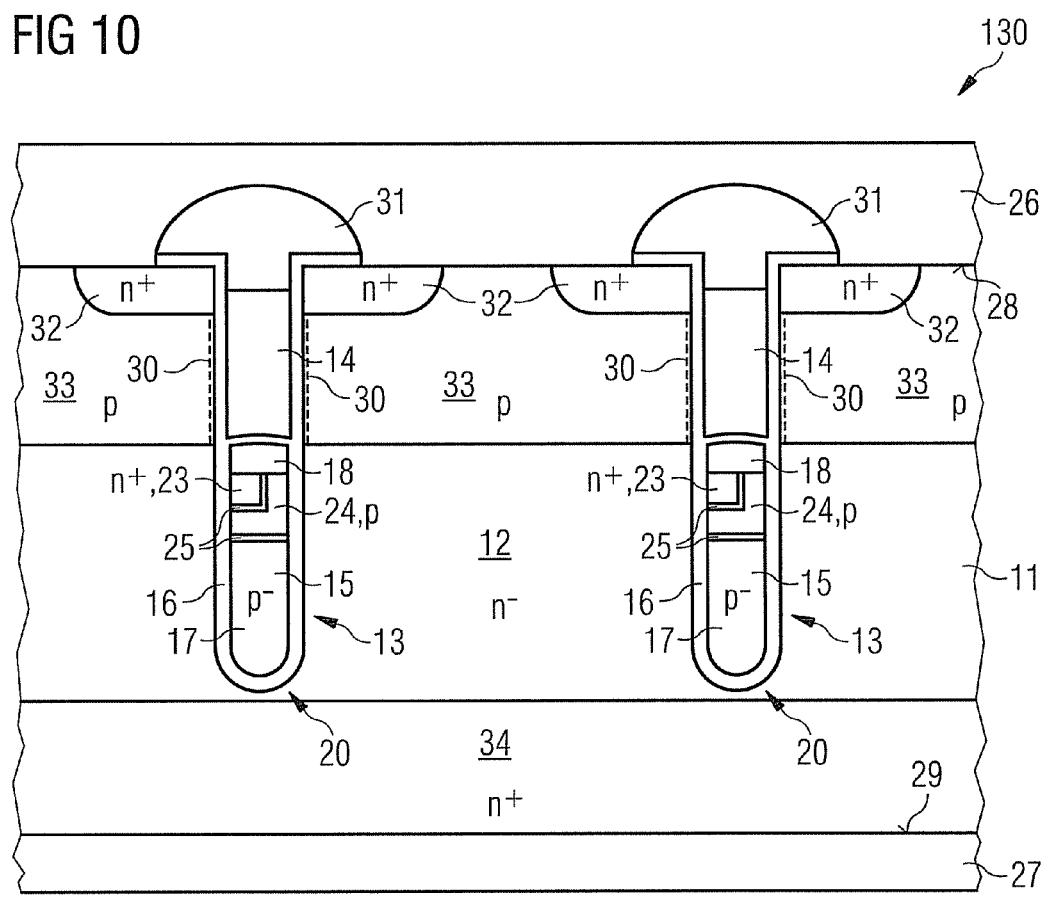
FIG. 10 illustrates a diagrammatic cross-section through a section of a field effect transistor.

FIG. 10 illustrates a diagrammatic cross-section through a section of a field effect transistor 130. Components of the same function as those in the previous figures are identified by the same reference numbers and are not explained again below.

In the illustrated embodiment, the region 24 of the first semiconducting material 17 is higher doped than the rest of the first semiconducting material 17. A second semiconducting material 23, which is n+-doped, is arranged adjacent to the contact region 18.

Diffusion barrier layers 25 are arranged both between the region 24 and the remaining part of the first semiconducting material 17 and the region 24 and the second semiconducting material 23. The material of the diffusion barrier layer 25 may be the same as the material of the diffusion barrier layer 25 of the field effect transistor 120 illustrated in FIG. 9.

Providing the diffusion barrier layers 25 may reduce or omit the diffusion of dopants from one semiconducting material to the other, as already discussed above in connection with the field effect transistor 70 illustrated in FIG. 4.

Figure 11:
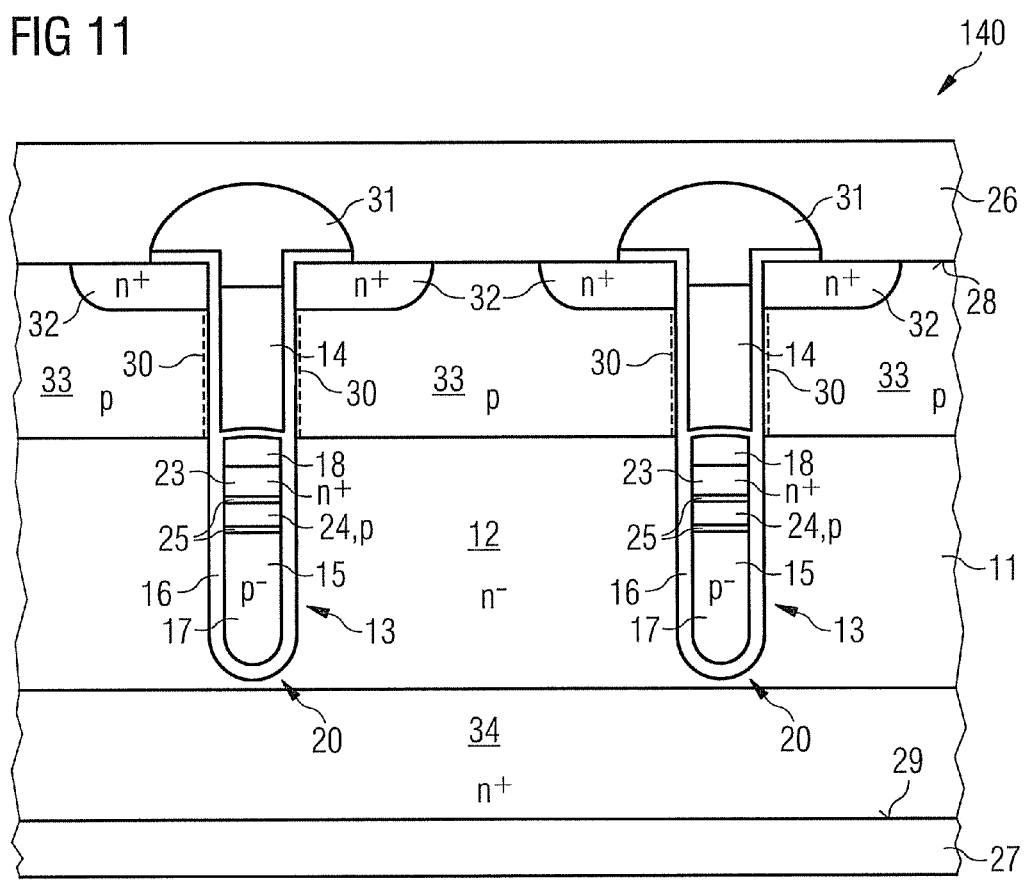
FIG. 11 illustrates a diagrammatic cross-section through a section of a field effect transistor.

FIG. 11 illustrates a diagrammatic cross-section through a section of a field effect transistor 140. Components of the same function as those in the previous figures are identified by the same reference numbers and are not explained again below.

Diffusion barrier layers 25 are arranged both between the region 24 and the remaining part of the first semiconducting material 17 and the region 24 and the second semiconducting material 23.

Figure 12:
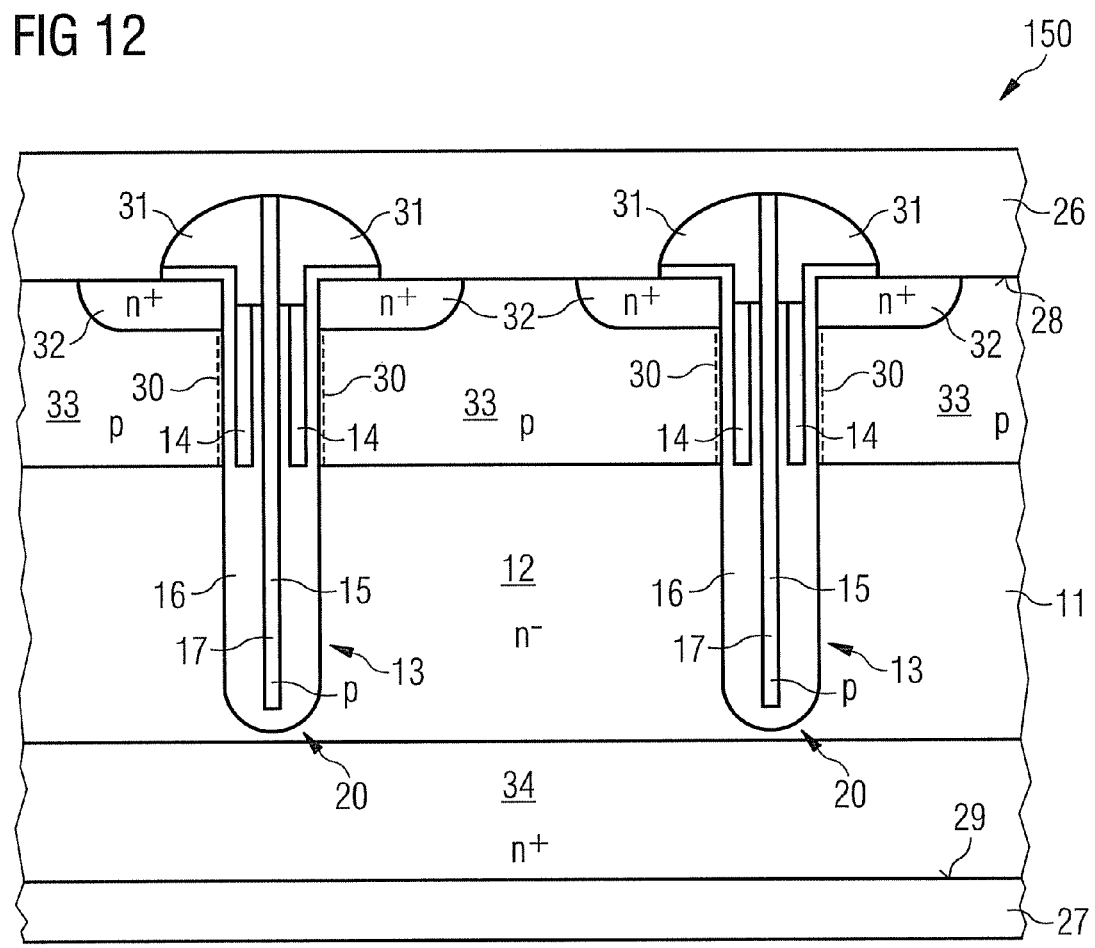
FIG. 12 illustrates a diagrammatic cross-section through a section of a field effect transistor.

The field effect transistor 140 differs from the field effect transistor 130 illustrated in FIG. 10 in that the first semiconducting material 17 is not connected to the contact region FIG. 12 illustrates a diagrammatic cross-section through a section of a field effect transistor 150. Components of the same function as those in the previous figures are identified by the same reference numbers and are not explained again below.

The field effect transistor 150 differs from the field effect transistors illustrated in the previous Figures in that the field plate 15 is arranged both in a lower portion of the trench 13 and in an upper portion of the trench 13. Moreover, the field plate 15 extends through the insulating region 31 and is in direct contact with the first electrode 26.

Two gate electrodes 14 are arranged in the upper portion of the trench 13. The field plate 15 and the gate electrodes 14 are thus partially arranged side by side in the upper portion of the trench 13.

The field plate 15 includes a first semiconducting material 17, which in the illustrated embodiment may for example be lightly p-doped polysilicon.

Figure 13:
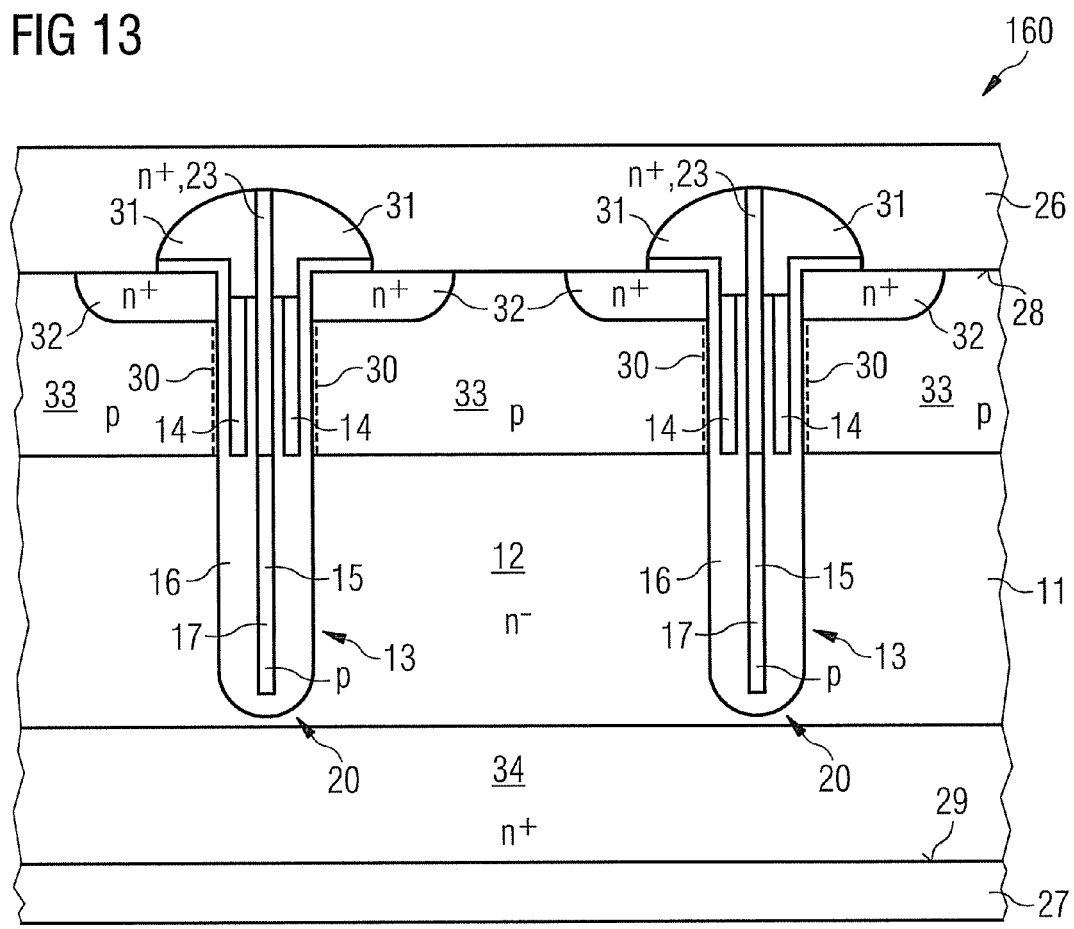
FIG. 13 illustrates a diagrammatic cross-section through a section of a field effect transistor.

FIG. 13 illustrates a diagrammatic cross-section through a section of a field effect transistor 160. Components of the same function as those in the previous figures are identified by the same reference numbers and are not explained again below.

The field effect transistor 160 differs from the field effect transistor 150 illustrated in FIG. 12 in that the field plate 15 includes a second semiconducting material 23, which is at least partially arranged between the first semiconducting material 17 and the first electrode 26 and adjacent to the first electrode 26. The second semiconducting material 23 may be of the same conductivity type as the conductivity type of the drift region 12 and may have a doping concentration, which is higher than the doping concentration of the first semiconducting material 17.

Figure 14:
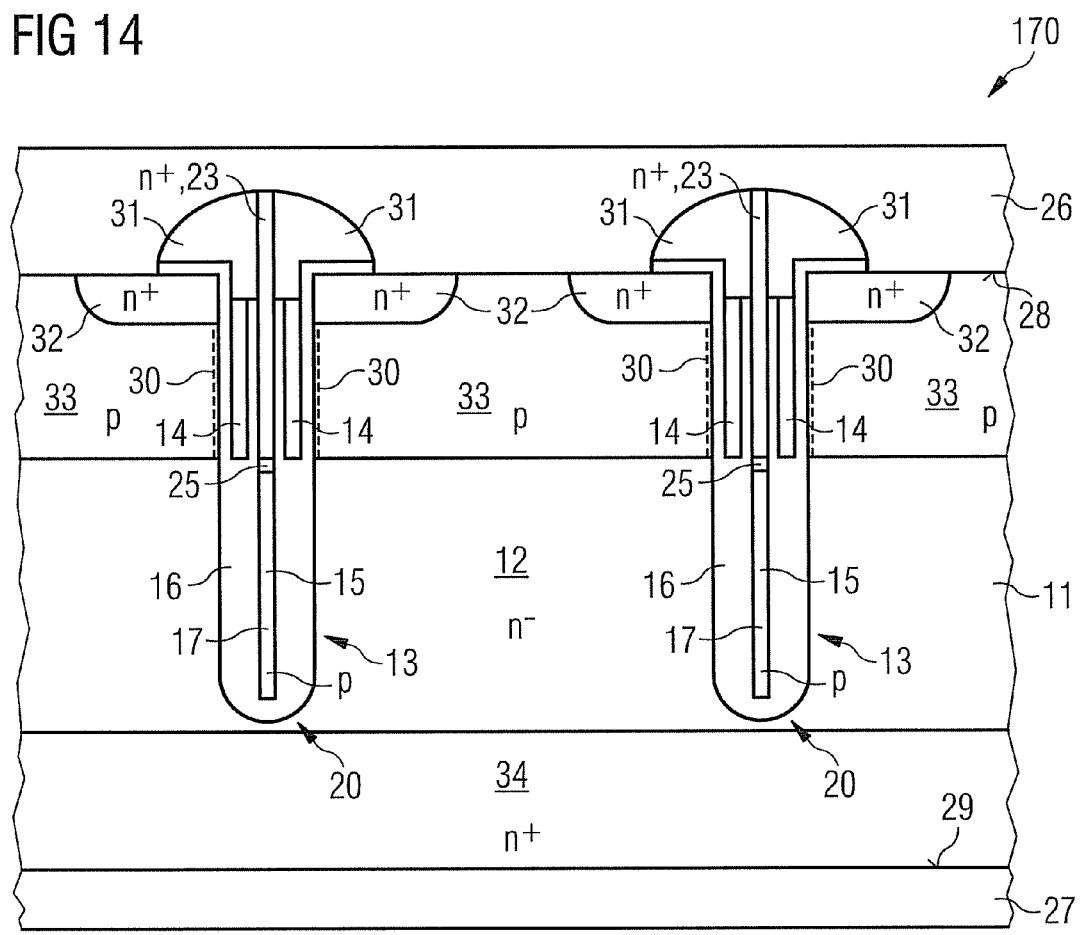
FIG. 14 illustrates a diagrammatic cross-section through a section of a field effect transistor.

FIG. 14 illustrates a diagrammatic cross-section through a section of a field effect transistor 170. Components of the same function as those in the previous figures are identified by the same reference numbers and are not explained again below.

In the illustrated embodiment, a diffusion barrier layer 25 is arranged at least partially between the first semiconducting material 17 and the second semiconducting material 23. The material of the diffusion barrier layer 25 may be the same as the material of the diffusion barrier layer 25 of the field effect transistor 120 illustrated in FIG. 9.

Providing the diffusion barrier layer 25 may reduce or omit the diffusion of dopants from one semiconducting material to the other, as already discussed above.

Figure 15:
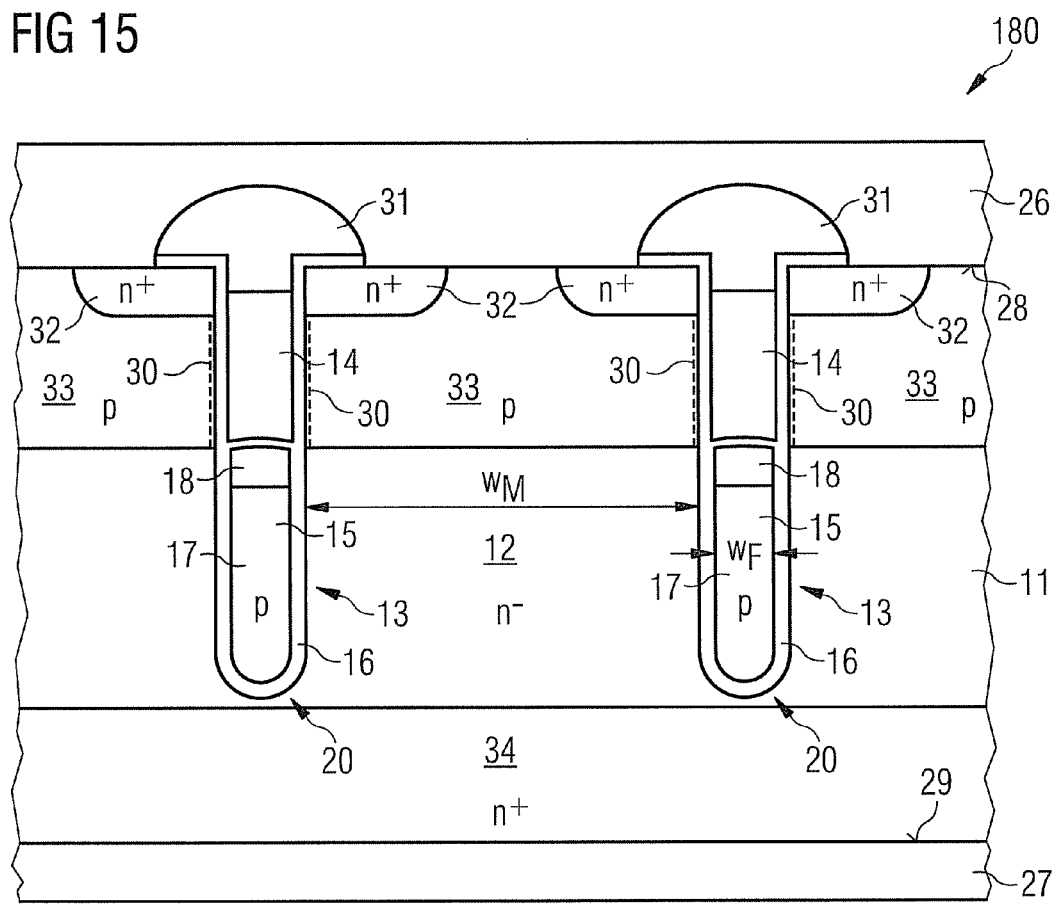
FIG. 15 illustrates a diagrammatic cross-section through a section of a field effect transistor.

FIG. 15 illustrates a diagrammatic cross-section through a section of a field effect transistor 180. Components of the same function as those in the previous figures are identified by the same reference numbers and are not explained again below.

The number of charge carriers of the first conductivity type, which in the illustrated embodiment is n-type, in the drift region 12 is essentially equal to the number of charge carriers of the second conductivity type, which in the illustrated embodiment is p-type, in the field plate 15. In other words, the product of the doping concentration of the drift region 12 and the lateral dimension $w_M$ of a mesa of the drift region 12, i.e., the distance between two adjacent trenches 13, is essentially equal to the product of the doping concentration of the field plate 15 and the width $w_F$ of the field plate 15, especially in case the two doping concentrations are essentially constant.

When the field effect transistor 180 is reverse-biased at high drain to source voltages, both the drift region 12 and the field plate 15 are depleted. Thus, a high blocking voltage may be attained also without a formation of an n-channel at an interface of the field plate 15 to the dielectric material 16. Therefore, providing a second semiconducting material of n-type conductivity in the field plate 15 may be omitted, which leads to an easier method for the production of the field effect transistor 180.

In the illustrated embodiment, the first semiconducting material 17 has a constant doping concentration. In a non-illustrated embodiment, the first semiconducting material 17 has a variable doping concentration in a vertical direction towards the base 20 of the trench 13, wherein in a region, which is adjacent to the contact region 18, the doping concentration is higher than in the remaining part of the semiconducting material 17. The region which is higher doped is then not completely depleted when the field effect transistor is reverse-biased at high drain to source voltages.

Figure 16:
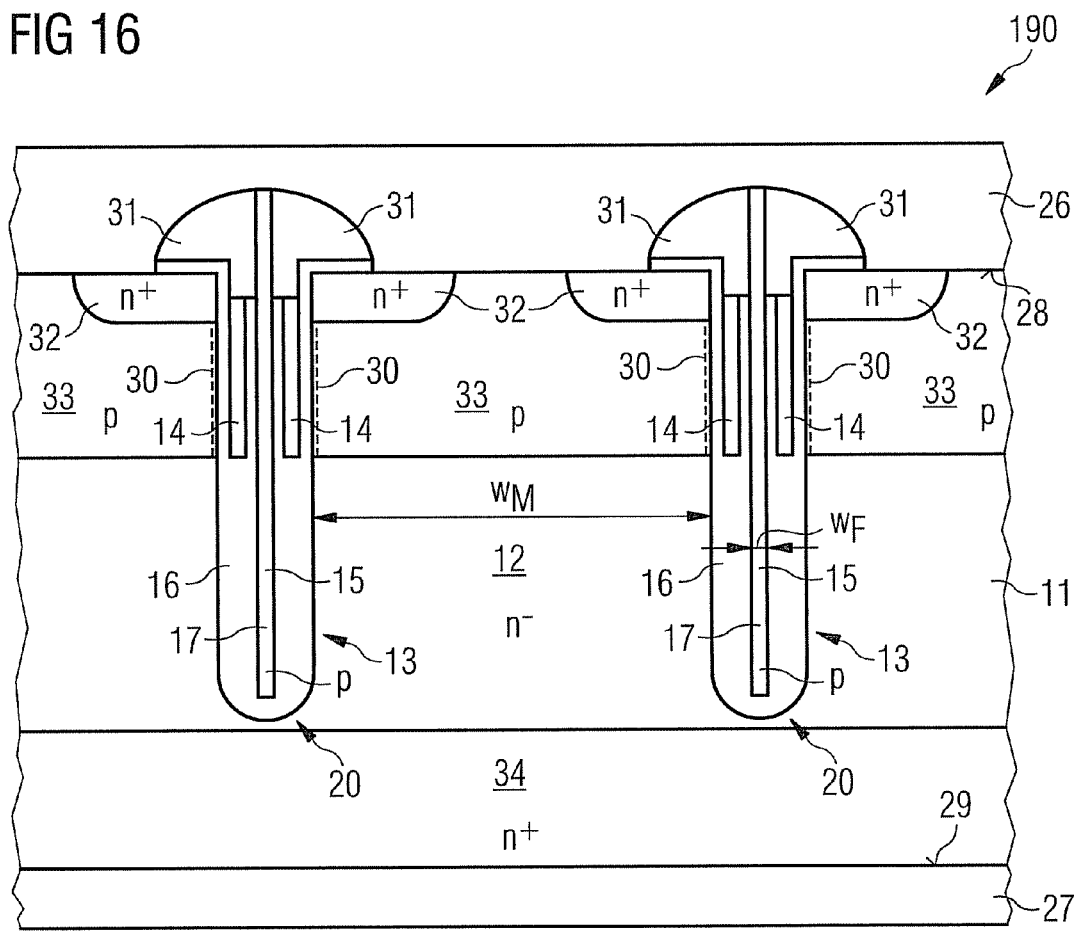
FIG. 16 illustrates a diagrammatic cross-section through a section of a field effect transistor.

FIG. 16 illustrates a diagrammatic cross-section through a section of a field effect transistor 190. Components of the same function as those in the previous figures are identified by the same reference numbers and are not explained again below.

The field effect transistor 190 differs from the field effect transistor 180 illustrated in FIG. 15 in that the field plate 15 is arranged both in a lower portion of the trench 13 and in an upper portion of the trench 13 and is in direct contact with the first electrode 26.

As in the previous embodiment illustrated in FIG. 15, the number of n-type charge carriers in the drift region 12 is essentially equal to the number of p-type charge carriers in the field plate 15, i.e., the product of the doping concentration of the drift region 12 and the lateral dimension $w_M$ of a mesa of the drift region 12 is essentially equal to the product of the doping concentration of the field plate 15 and the width $w_F$ of the field plate 15. The field effect transistor 190 therefore has similar blocking characteristics as the field effect transistor 180, which will not be listed again to avoid repetition.

In the illustrated embodiment, the first semiconducting material 17 has a constant doping concentration. In a non-illustrated embodiment, the first semiconducting material 17 has a variable doping concentration in a vertical direction towards the base 20 of the trench 13, wherein in a region, which is adjacent to the contact region 18, the doping concentration is higher than in the remaining part of the semiconducting material 17. The region which is higher doped is then not completely depleted when the field effect transistor is reverse-biased at high drain to source voltages.

Figure 17:
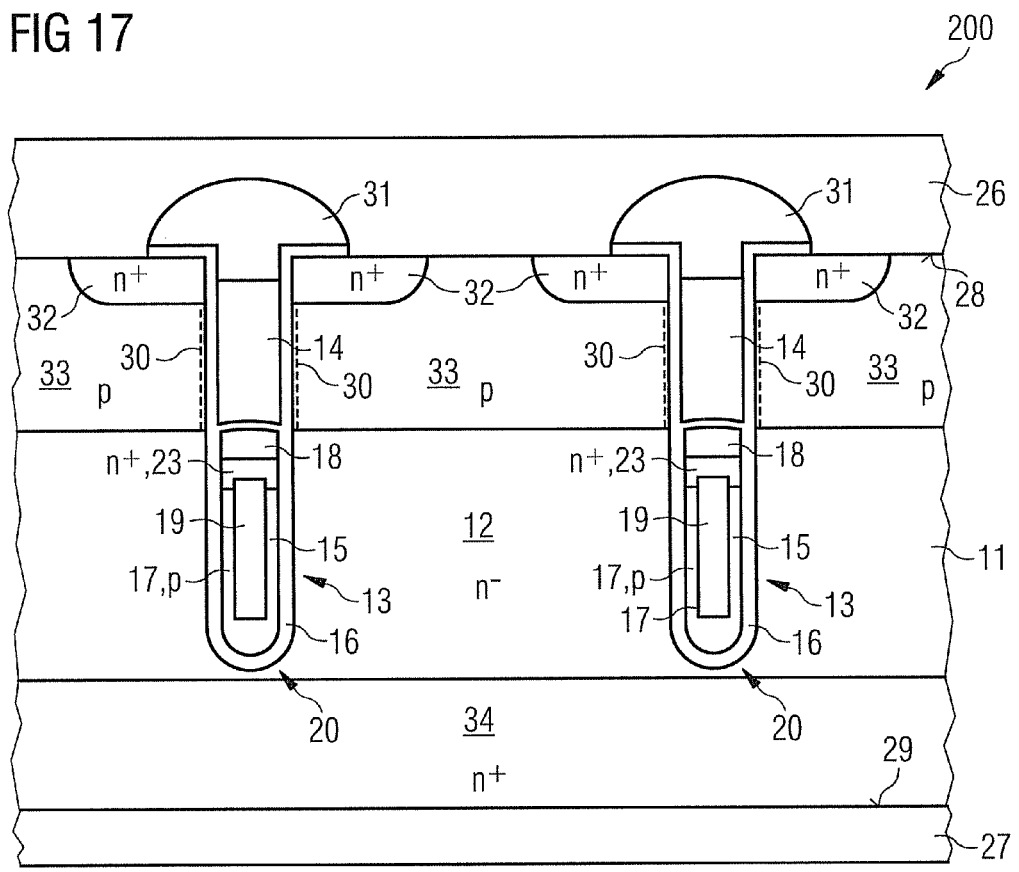
FIG. 17 illustrates a diagrammatic cross-section through a section of a field effect transistor.

FIG. 17 illustrates a diagrammatic cross-section through a section of a field effect transistor 200. Components of the same function as those in the previous figures are identified by the same reference numbers and are not explained again below.

The field effect transistor 200 differs from the field effect transistors illustrated in the previous figures in that the field plate 15 additionally contains a metal 19, which is arranged adjacent to the first semiconducting material 17 and the second semiconducting material 23.

The metal 19 may for example contain gold or platinum.

As already discussed above, an n-channel may be formed at an interface of the field plate 15 to the dielectric material 16 at high drain to source voltages when the field effect transistor is reverse-biased. In the previously illustrated embodiments, after a first overshooting of the drain to source voltage at reverse-bias, the n-channel is still provided for lower drain to source voltages as long as the field effect transistor is reverse-biased. In the embodiment illustrated in FIG. 17, the metal 19 may provide centers of recombination for the electrons of the n-channel. When the drain to source voltage decreases after the first overshooting at reverse-bias, the electrons may recombine in the centers of recombination, which may lead to a weakening or a removal of the n-channel. The depletion zone may therefore extend into the field plate 15 after a first overshooting of the drain to source voltage, which may lead to a reduced drain to source capacitance as already explained above.

In a non-illustrated embodiment, centers of recombination are provided in the field plate 15 by a highly doped semiconducting material, for example by $n^+$-doped polysilicon or by $p^+$-doped polysilicon.

In a further non-illustrated embodiment, centers of recombination are provided in the field plate 15 by a change in the structure of the first semiconducting material 17, which is for example lightly doped polysilicon. For that purpose, the first semiconducting material 17 may include a nitrided semiconducting material, for example nitrided polysilicon.

In a further non-illustrated embodiment, centers of recombination are provided in the field plate 15 by the implantation of elementary particles or ions in the field plate 15, for example protons, electrons or neutrons or helium.

Figure 18:
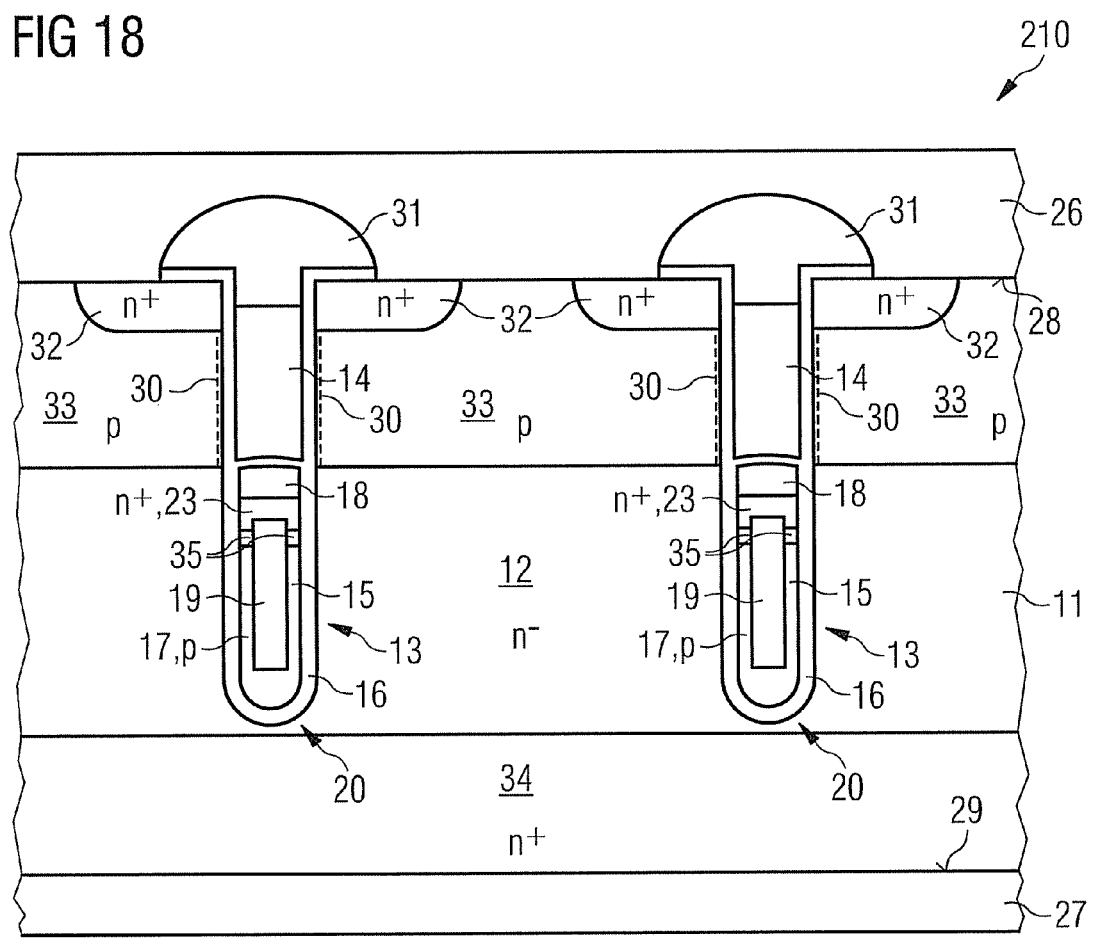
FIG. 18 illustrates a diagrammatic cross-section through a section of a field effect transistor.

FIG. 18 illustrates a diagrammatic cross-section through a section of a field effect transistor 210. Components of the same function as those in the previous figures are identified by the same reference numbers and are not explained again below.

The field effect transistor 210 differs from the field effect transistor 200 illustrated in FIG. 17 in that a tunneling layer 35 is arranged at least partially between the first semiconducting material 17 and the second semiconducting material 23 and adjacent to the metal 19 at a region of the field plate 15 close to the contact region 18.

In a non-illustrated embodiment, a highly doped semiconducting material is provided instead of the metal 19, for example $n^+$-doped polysilicon or $p^+$-doped polysilicon.

Figure 19:
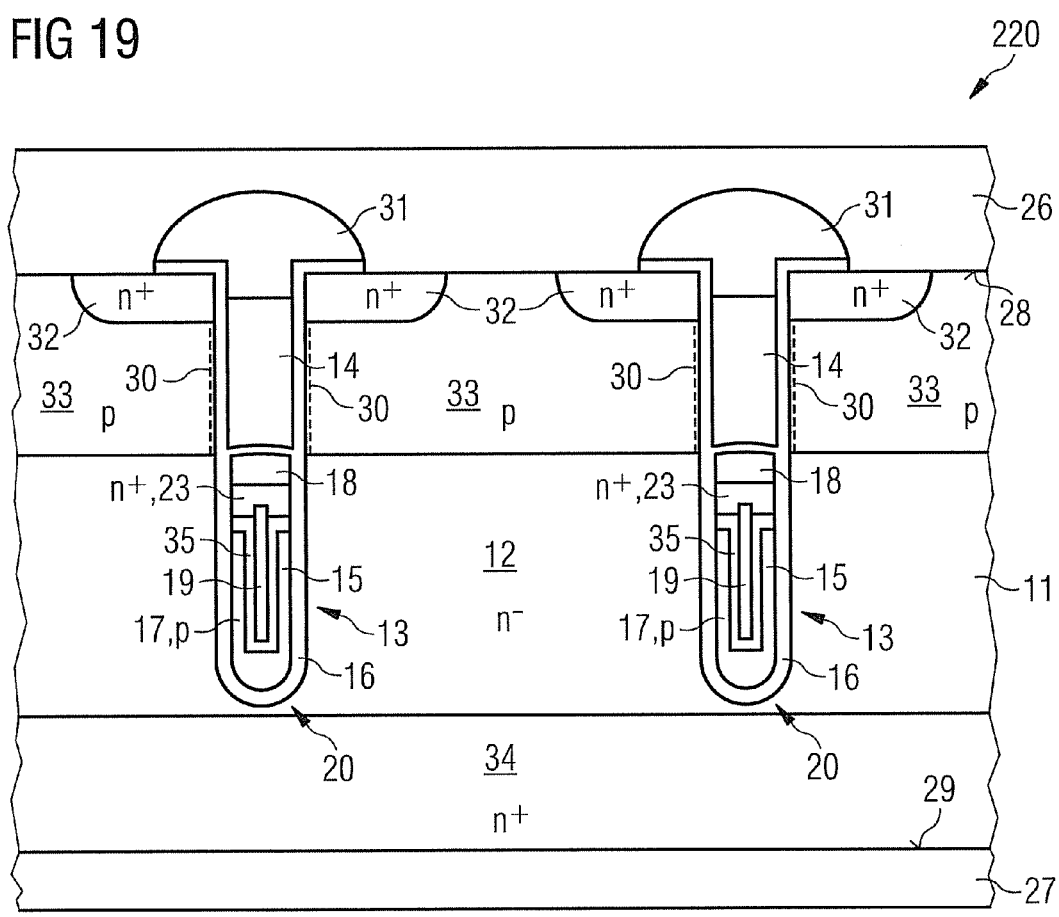
FIG. 19 illustrates a diagrammatic cross-section through a section of a field effect transistor.

FIG. 19 illustrates a diagrammatic cross-section through a section of a field effect transistor 220. Components of the same function as those in the previous figures are identified by the same reference numbers and are not explained again below.

In the illustrated embodiment, a tunneling layer 35 is arranged at least partially between the first semiconducting material 17 and the second semiconducting material 23 and adjacent to the metal 19 both in a region which is close to the contact region 18 and in a remaining lower region of the field plate 15.

In a non-illustrated embodiment, a highly doped semiconducting material is provided instead of the metal 19, for example $n^+$-doped polysilicon or $p^+$-doped polysilicon.

The materials of the individual components of the field effect transistors 50 to 220 illustrated in FIGS. 2 to 19 may be the same as the materials of the corresponding components of the field effect transistor 10 illustrated in FIG. 1.

In addition to the semiconductor device structure for at least one n-channel MOSFET for the field effect transistors 50 to 220 illustrated in FIGS. 2 to 19, in non-illustrated embodiments the field effect transistors have a semiconductor device structure for at least one p-channel MOSFET. In this case, the doping of the individual regions of the p-channel MOSFET complements the doping of the corresponding regions of the n-channel MOSFET.

In further non-illustrated embodiments, the field effect transistors have a semiconductor device structure for at least one IGBT, which may be an n-channel IGBT or a p-channel IGBT or a drain up structure, as already explained in connection with FIG. 1.

In further non-illustrated embodiments, some of the gate electrodes may also be connected to the first electrode, thereby proving an increased switching speed of the field effect transistors.

In FIGS. 1 to 19, only a section of an active region of the field effect transistors 10 to 220 is illustrated. The field effect transistors 10 to 220 may further have an edge region, the edge region enclosing the active region and extending to an edge of the semiconductor body. In the edge region, further components of the field effect transistors may be arranged.

FIGS. 1 to 19 illustrate diagrammatic cross-sections through sections of the field effect transistors 10 to 220. In plan view (not illustrated), the trenches 13 of the field effect transistors 10 to 220 are arranged in a stripe-like geometry. The trenches 13 may also be arranged for example in a grid-like geometry or a point-like geometry. In a stripe-like geometry, the trenches 13 are arranged essentially parallel to each other. In a grid-like geometry, the trenches 13 may be arranged perpendicular to each other or may include an angle which is different from 90°.

In the embodiments illustrated in FIGS. 1 to 19, the at least one gate electrode 14 and the field plate 15 are arranged in a common trench 13. In non-illustrated embodiments, the at least one gate electrode may be arranged in a first trench and the field plate may be arranged in a second trench different from the first trench. The field plate may be at least partially arranged at a vertically lower position with respect to the first surface of the semiconductor body in the second trench than the at least one gate electrode in the first trench.

Figure 20:
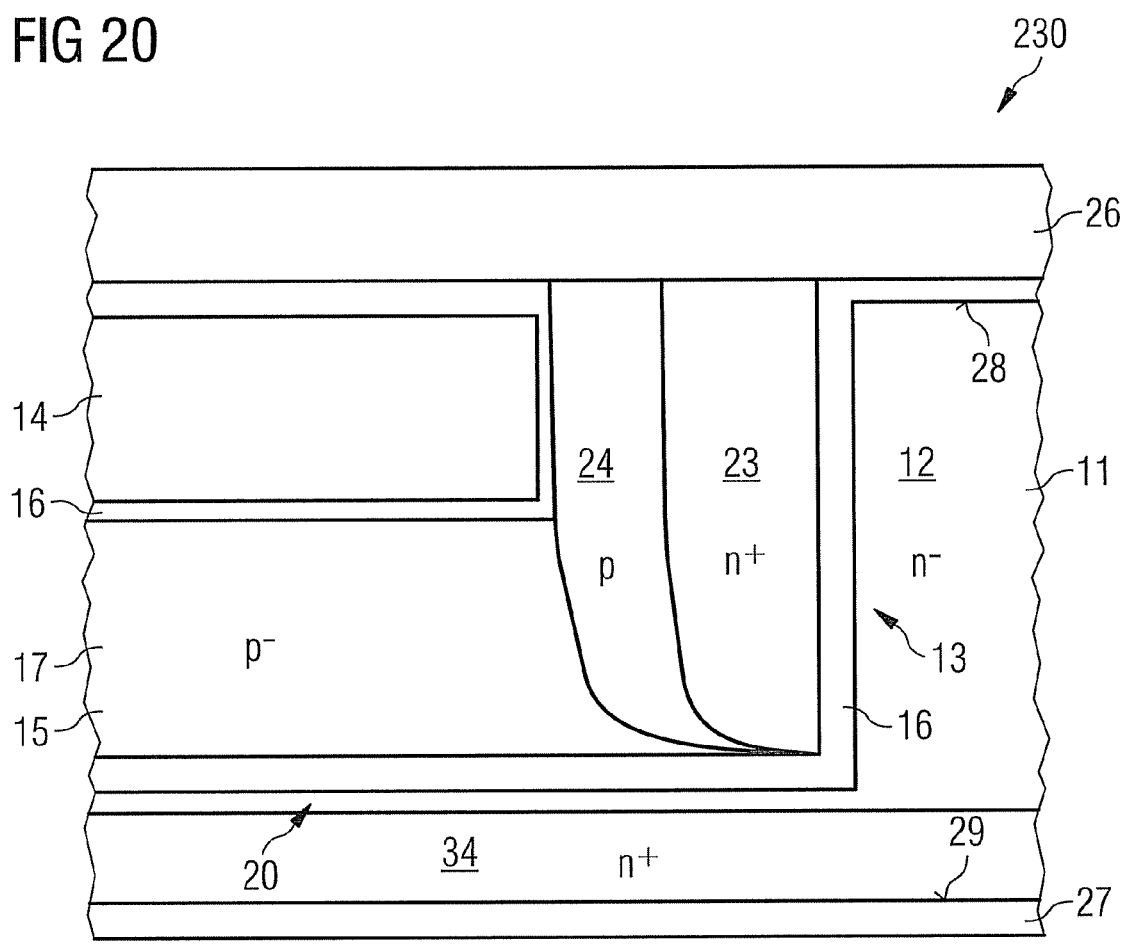
FIG. 20 illustrates a diagrammatic cross-section through a section of a field effect transistor.

FIG. 20 illustrates a diagrammatic cross-section through a section of a field effect transistor 230. Components of the same function as those in the previous figures are identified by the same reference numbers and are not explained again below.

In FIG. 20, a cross-section through the field effect transistor 230 in a vertical direction, i.e. in a direction perpendicular to the direction of the cross-sections illustrated in FIGS. 1 to 19, is illustrated.

In the illustrated embodiment, the second semiconducting material 23 is arranged in an edge region of the trench 13 and extends from the upper end of the trench 13 to the base 20. The second semiconducting material 23, which is $n^+$-doped in the illustrated embodiment, is in direct contact with the first electrode 26. Thus, providing an additional contact region in the field plate 15, the contact region electrically coupling the field plate 15 to the first electrode 26, may be omitted.

The second semiconducting material 23 is adjoined by a region 24 of the first semiconducting material 17 which is higher doped than the rest of the first semiconducting material 17. In the illustrated embodiment, the first semiconducting material 17 is p-doped in the region 24, whereas in the remaining part, the first semiconducting material 17 is p$^-$-doped and the region 24 is in direct contact with the first electrode 26. In a non-illustrated embodiment, the region 24 is floating.

In a further non-illustrated embodiment, the second semiconducting material is arranged in an edge region of the trench and in at least a further region of the trench and extends from the upper end of the trench to the base.

In still a further non-illustrated embodiment, multiple regions 23 and 24 may also be arranged within the trench in predefined distances. One of the regions 23 or 24 may also be omitted.

Figure 21:
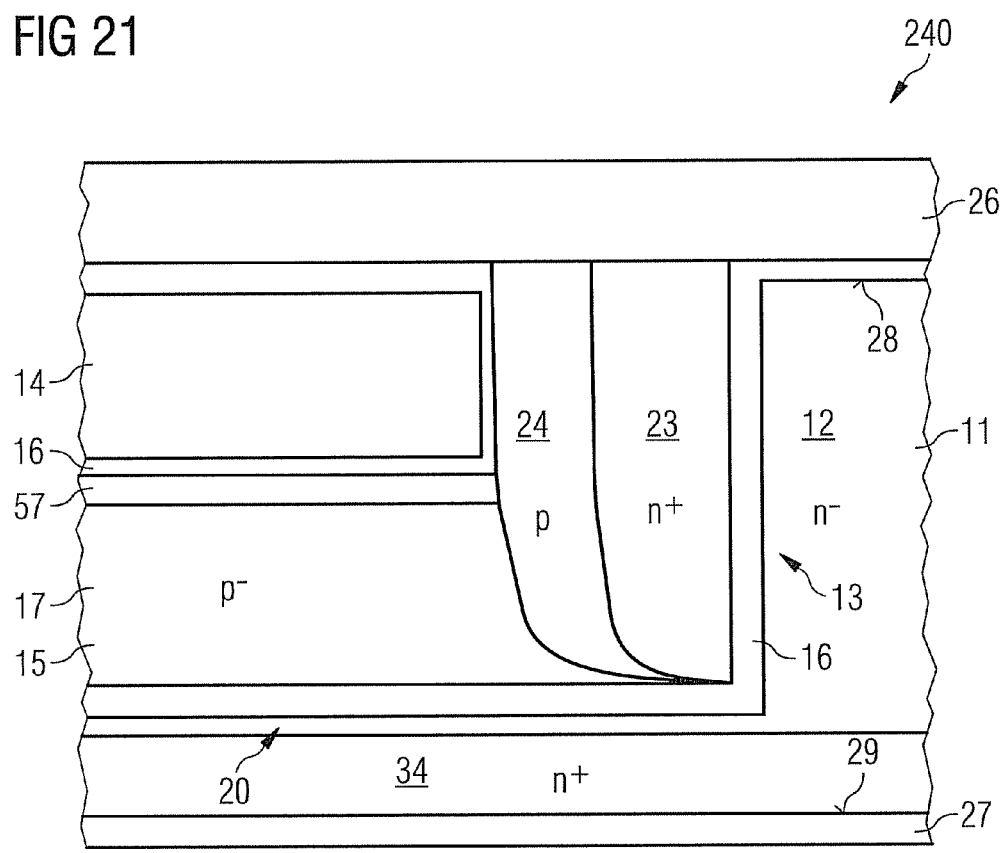
FIG. 21 illustrates a diagrammatic cross-section through a section of a field effect transistor.

FIG. 21 illustrates a diagrammatic cross-section through a section of a field effect transistor 240. Components of the same function as those in the previous figures are identified by the same reference numbers and are not explained again below.

In FIG. 21, a cross-section through the field effect transistor 240 in a vertical direction is illustrated in an analog way as for the field effect transistor 230 illustrated in FIG. 20.

The field effect transistor 240 differs from the field effect transistor 230 in that a highly conducting layer 57 is arranged at least partially between the first semiconducting material 17 and the gate electrode 14, thereby providing a screening electrode. The highly conducting layer 57 may for example contain a metal.

In a non-illustrated embodiment, multiple regions 23 and 24 may also be arranged within the trench in predefined distances. One of the regions 23 or 24 may also be omitted.

In the embodiments illustrated in FIGS. 1 to 21, the at least one gate electrode 14 is arranged in the at least one trench 13. In non-illustrated embodiments, the at least one gate electrode may be arranged on the first surface of the semiconductor body and separated from the semiconductor body by an insulating layer.

FIGS. 22A to 22J illustrate a method for the production of a field effect transistor 250. Components of the same function as those in the previous figures are identified by the same reference numbers and are not explained again below.

Figure 22A:
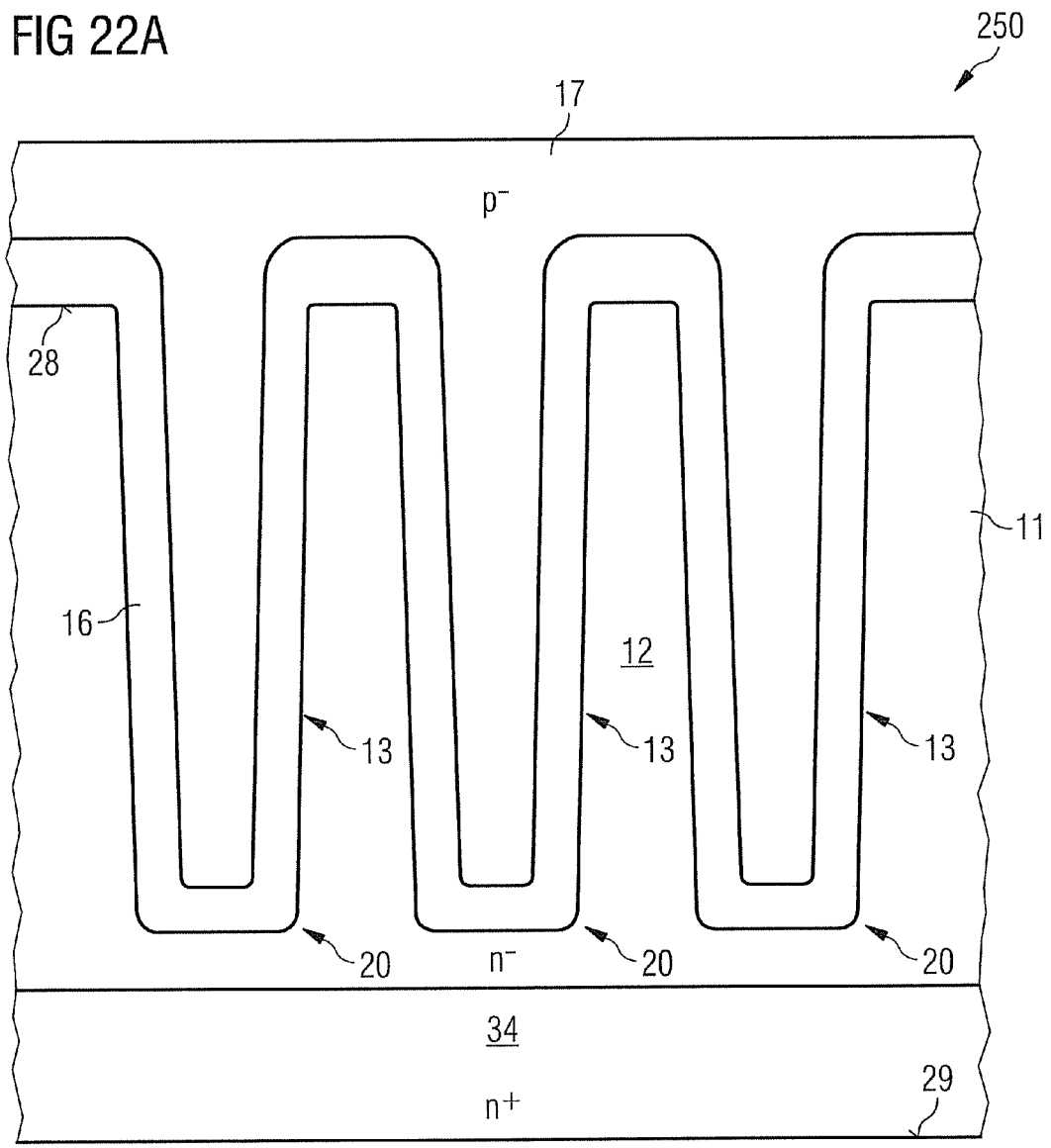

A semiconductor body 11 of a first conductivity type, which is an n-type in the illustrated embodiment, having an n$^+$-doped region 34 in a near surface region of the second surface 29 of the semiconductor body 11, which in the illustrated embodiment is a back-sided surface, and an n$^-$-doped drift region 12 on the n$^+$-doped region 34 is provided. The semiconductor body 11 may for example contain silicon. At least one trench 13 is formed in the drift region 12, for example by a masked etching process. A dielectric material 16, for example an oxide, is disposed at least partially on the first surface 28 of the semiconductor body 11, which in the illustrated embodiment is a front-sided surface, and the walls and the base 20 of the at least one trench 13. A first semiconducting material 17, which in the illustrated embodiment is lightly p-doped polysilicon, is disposed on the dielectric material 16. FIG. 22A illustrates the field effect transistor 250 after the above-mentioned process steps.

The first semiconducting material 17 is then partially recessed to substantially completely fill the trench 13 and a photoresist mask 36 is applied at least partially on the dielectric material 16 and the first semiconducting material 17 in an edge region 44 of the field effect transistor 250, the edge region 44 enclosing an active region 43 and extending to an edge of the semiconductor body 11. The field effect transistor 250 after the above-mentioned process steps is illustrated in FIG. 22B.

Figure 22C:
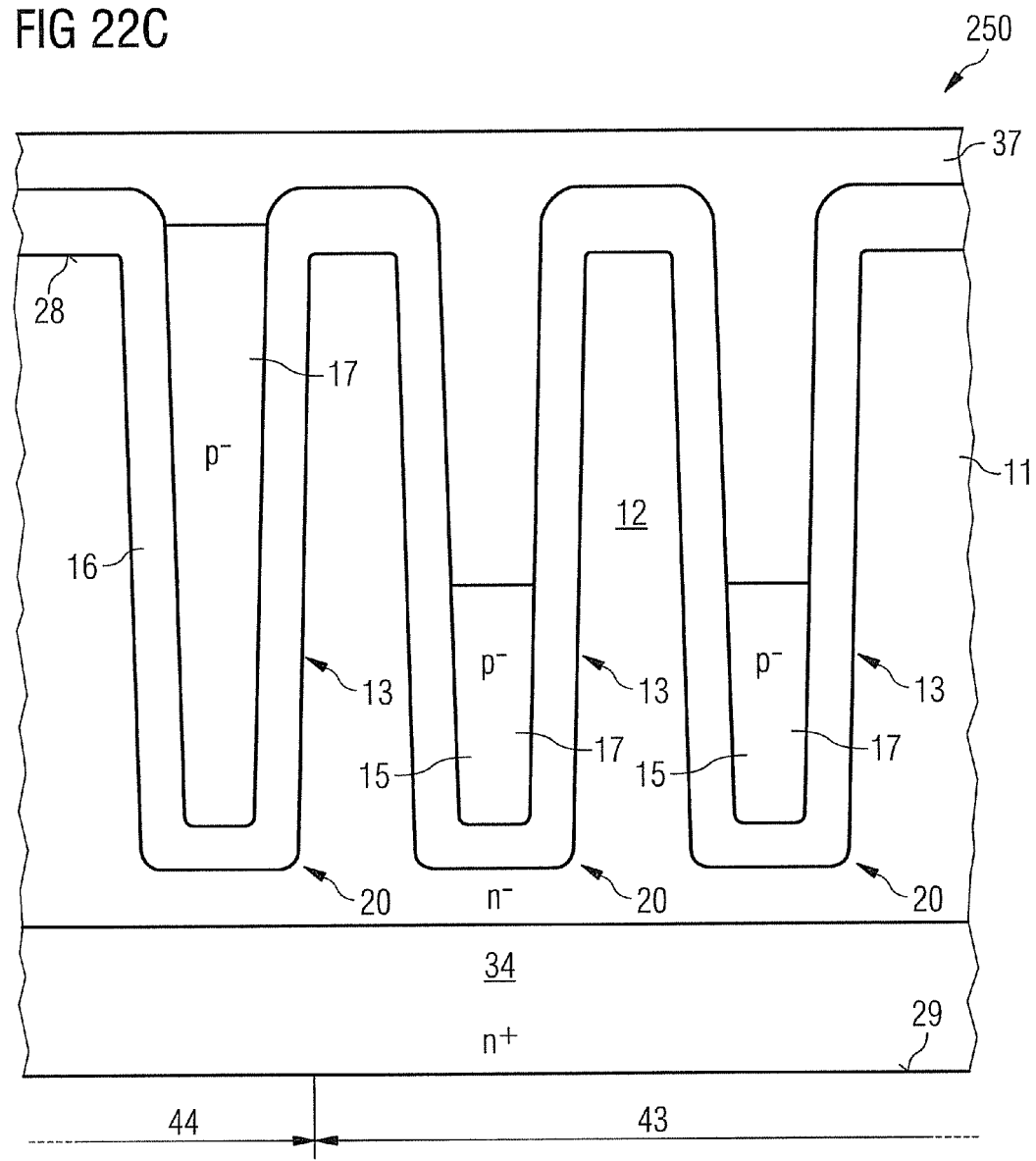

The first semiconducting material 17 is subsequently partially recessed in the region not covered by the photoresist mask 36 to substantially fill a lower portion of the trench 13 in the active region 43. The photoresist mask 36 is removed in a further process step and a further dielectric material, for instance a nitride 37, is at least partially deposited on the dielectric material 16 and the first semiconducting material 17 as illustrated in FIG. 22C.

The first semiconducting material 17 arranged in the edge region 44, the dielectric material 16 and the nitride 37 are then partially removed, for example by chemical-mechanical polishing, for producing an essentially planar first surface 28. A photoresist mask 38 is subsequently applied at least partially on the first surface 28 in the edge region 44 and the dielectric material 16 is partially removed in the regions not covered by the photoresist mask 38. FIG. 22D illustrates the field effect transistor 250 after the above-mentioned process steps.

The photoresist mask 38 is removed and an insulating layer 39 is provided at least partially on the first surface 28 in the active region 43 and the regions of the wall of the trench 13 arranged in the active region 43 which are not covered by the dielectric material 16. The insulating layer 39 may for example contain an oxide, which may be for instance deposited or produced by an oxidation process. In a further process step, two gate electrodes 14 are produced in the trench 13 arranged in the active region 43, for example by disposing highly doped polysilicon which is subsequently partially recessed. The field effect transistor 250 after the above-mentioned process steps is illustrated in FIG. 22E.

Figure 22F:
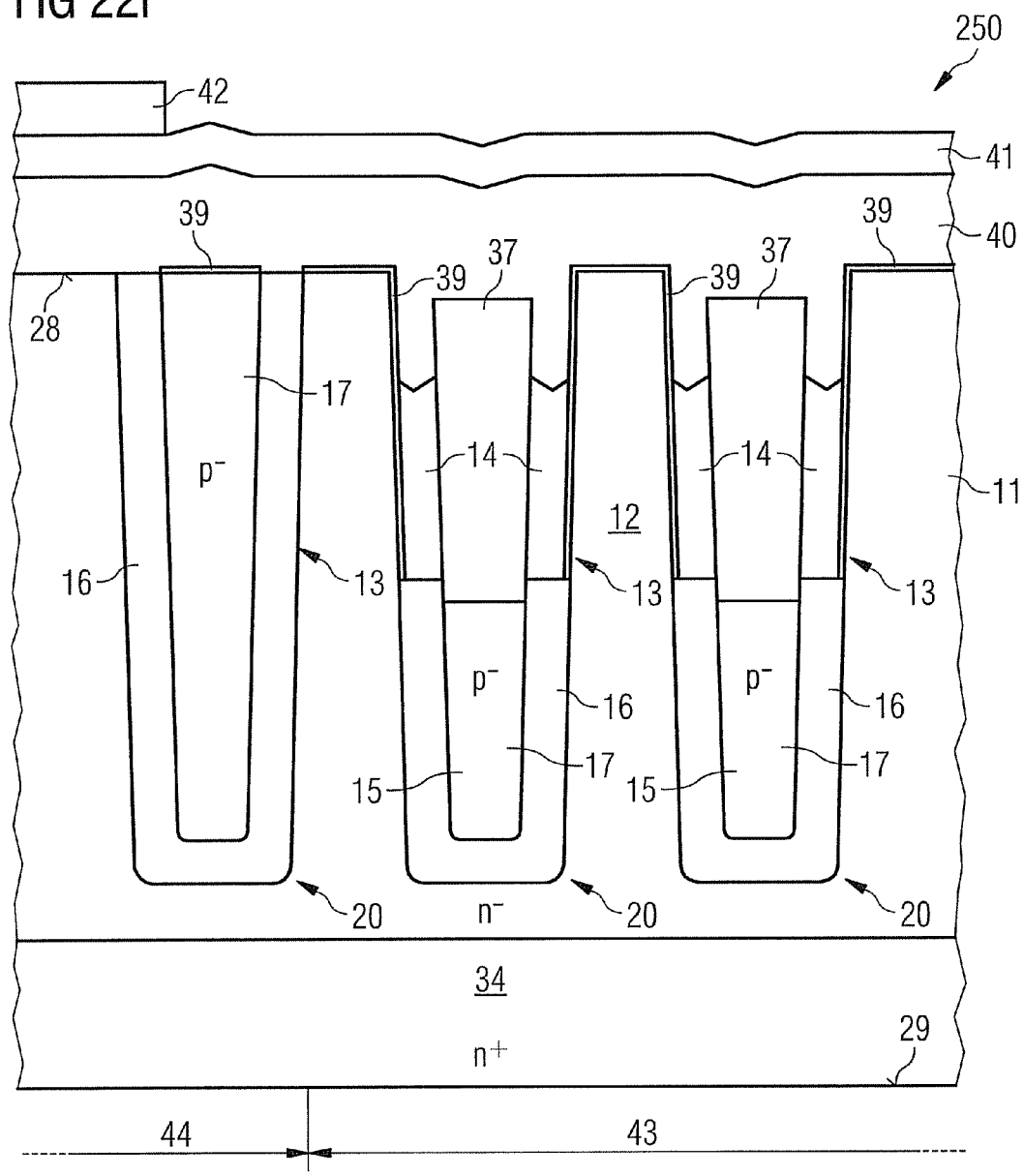

An insulating layer 40, which for example may contain tetraethyl orthosilicate (TEOS), is disposed at least partially on the insulating layer 39, the gate electrodes 14, the nitride 37, the dielectric material 16 and the first surface 28. A further layer 41, containing for example a boron phosphorus silicate glass or a phosphorus silicate glass, is subsequently deposited on the insulating layer 40. A photoresist mask 42 is then applied at least partially on the layer 41 in the edge region 44. FIG. 22F illustrates the field effect transistor 250 after the above-mentioned process steps.

Figure 22G:
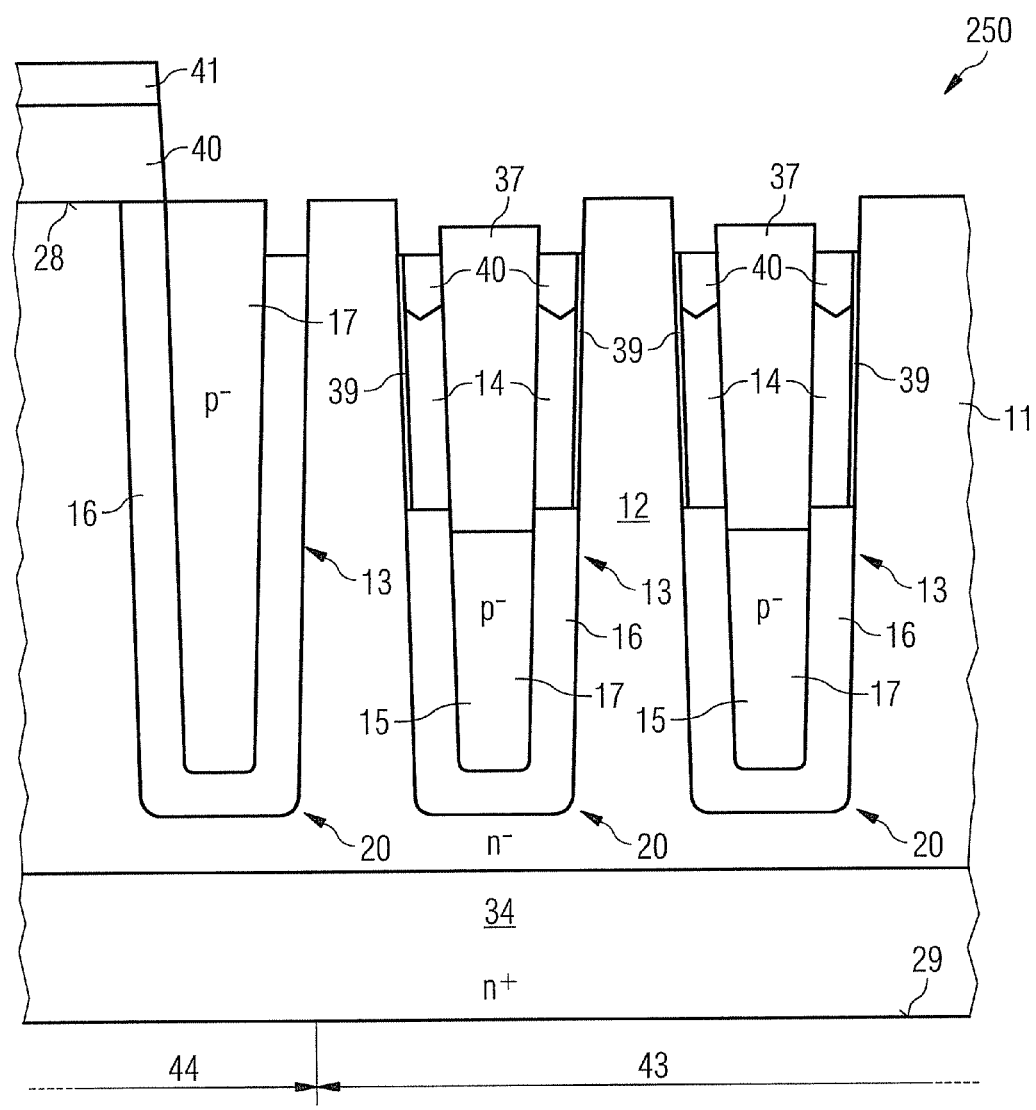

The layer 41, the insulating layer 40, the dielectric material 16 and the insulating layer 39 are then at least partially removed in the region not covered by the photoresist mask 42. In a further process step, the photoresist mask 42 is removed. The field effect transistor 250 after the above-mentioned process steps is illustrated in FIG. 22G.

Figure 22H:
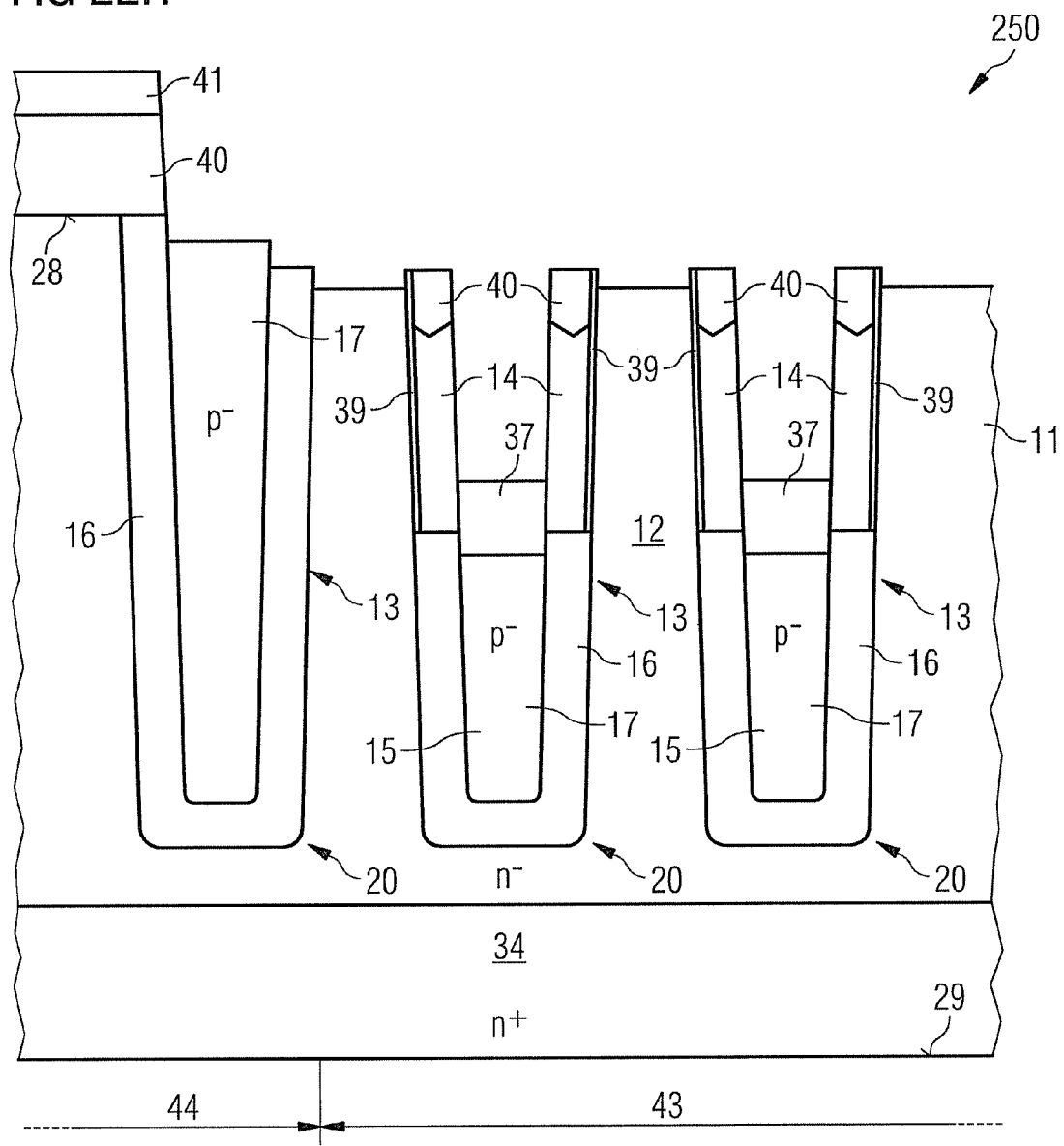

The first semiconducting material 17 arranged in the edge region 44, the nitride 37 and parts of the semiconductor body 11 at the first surface 28 are subsequently partially removed for example by etching with hot phosphoric acid. The thickness of the remaining nitride 37 is chosen so that a following implantation of a first dopant material and of a second dopant material may be used in the trench 13 arranged in the active region 43, as explained in more detail in relation with FIG. 22I. FIG. 22H illustrates the field effect transistor 250 after the above-mentioned process steps.

Figure 22I:
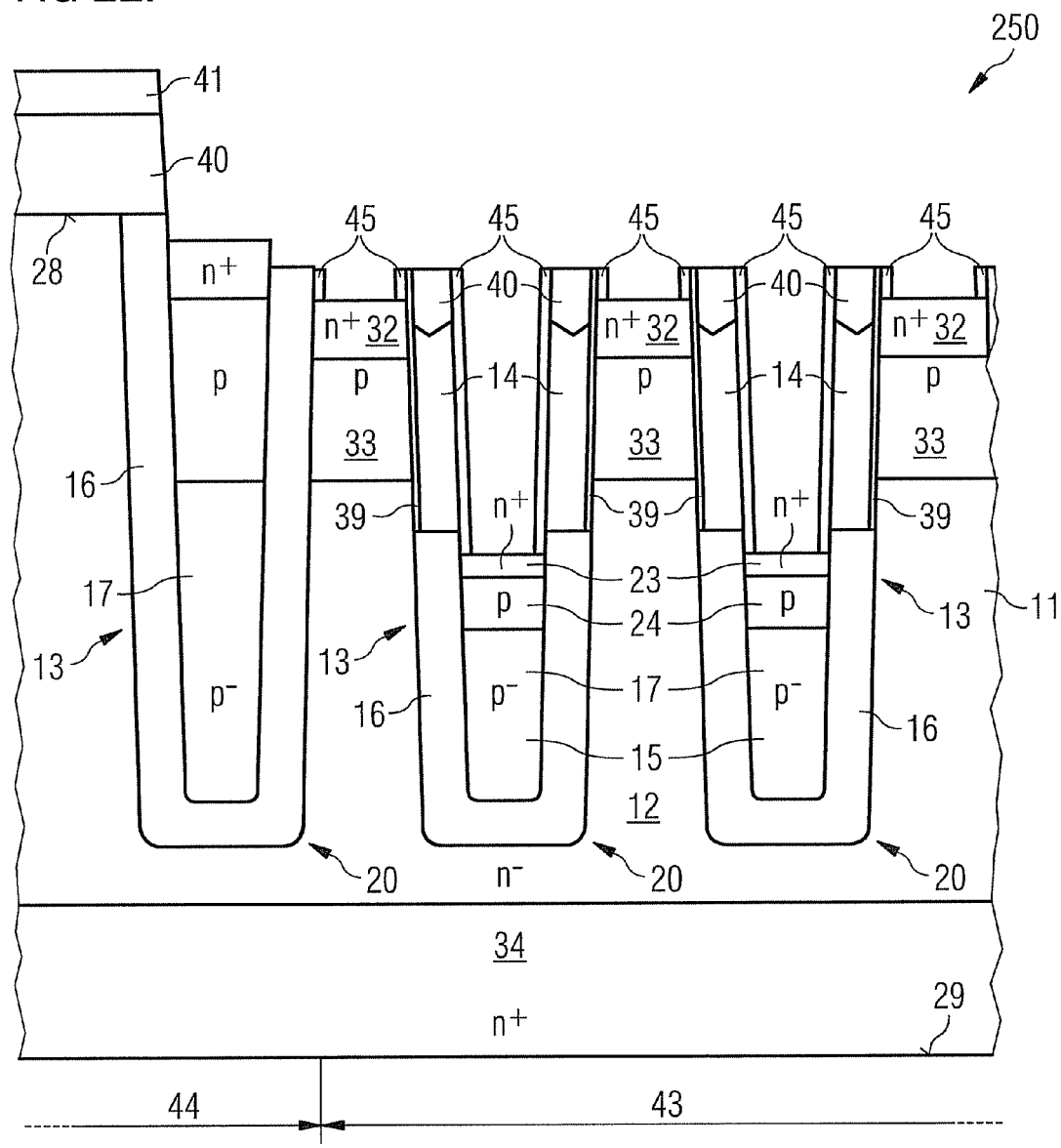

In a further process step, the first dopant material is implanted in a near surface-region of the first surface 28. The first dopant material is additionally implanted in the trench 13 arranged in the active region 43 and subsequently driven in both in the trench 13 and the near-surface region of the first surface 28, thereby providing a p-doped body zone 33 and a region 24 of the first semiconducting material 17, which is higher doped than the rest of the first semiconducting material 17. Accordingly, the second dopant material is implanted and driven in both in the trench 13 arranged in the active region 43 and a near-surface region of the first surface 28, thereby providing an n$^+$-doped source region 32 and a second semiconducting material 23 of the field plate 15, which is of the same conductivity type as the drift region 12. The nitride 37 is then completely removed, for example by etching with hot phosphoric acid, and an insulating layer 45, for example TEOS, is deposited at least partially on the exposed parts of the gate electrodes 14, the insulating layers 39 and 40 and the dielectric material 16, as illustrated in FIG. 22I.

Figure 22J:
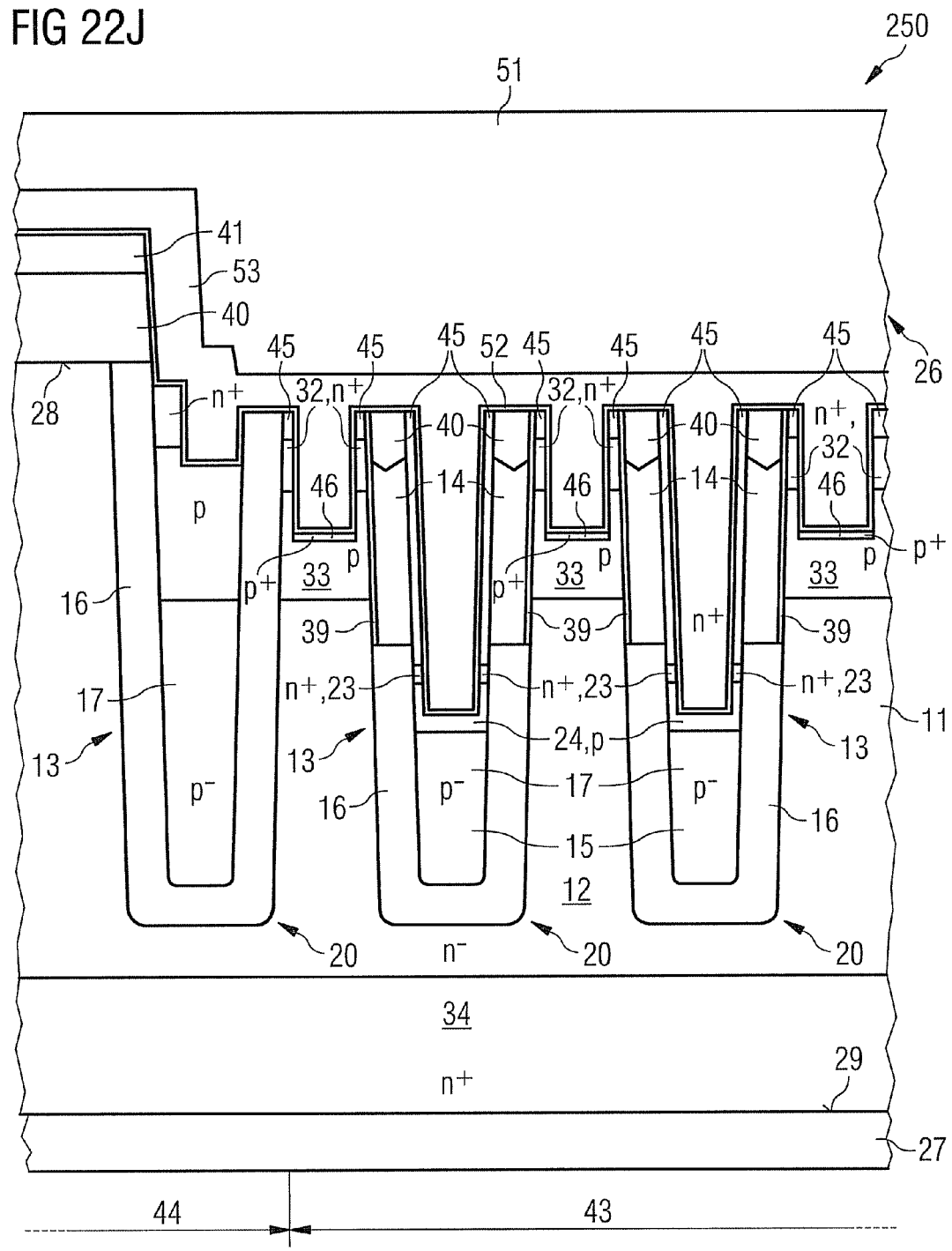

Contact holes are produced in the source region 32, the body zone 33 and in the trench 13 arranged in the active region 43 for example by etching. In further process steps, a p$^+$-doped region 46 is produced at least partially in a near-surface region of the body zone 33, for instance by implanting a dopant material and a subsequent rapid thermal processing (RTP), and an adhesive layer 52, for example containing Ti or TiN, is disposed both in the active region 43 and the edge region 44. Subsequently, a first electrode 26 is produced for instance by the deposition of at least one metal layer on the adhesive layer 52. In the illustrated embodiment, the first electrode 26 includes a first metal layer 53, which for example contains tungsten and is disposed on the adhesive layer 52, and a second metal layer 51, disposed on the first metal layer 53. Additionally, a second electrode 27 is produced on the second surface 29, for instance by disposing a metal. FIG. 22J illustrates the field effect transistor 250 after the above-mentioned process steps.

FIGS. 23A to 23F illustrate a method for the production of a field effect transistor 260. Components of the same function as those in the previous figures are identified by the same reference numbers and are not explained again below.

The initial process steps for the production of the field effect transistor 260 may be the same as those for the production of the field effect transistor 250 illustrated in FIGS. 22A to 22E and are not listed again to avoid repetition. After the deposition of the gate electrodes 14 and the partial recess of the latter, an insulating layer 47 is produced at least partially on the exposed parts of the insulating layer 39 and the gate electrodes 14, for example by an oxidation process. On the insulating layer 47 and at least partially on the first surface 28, a further insulating layer 40, which for example contains TEOS, is disposed. FIG. 23A illustrates the field effect transistor 260 after the above-mentioned process steps.

Figure 23B:
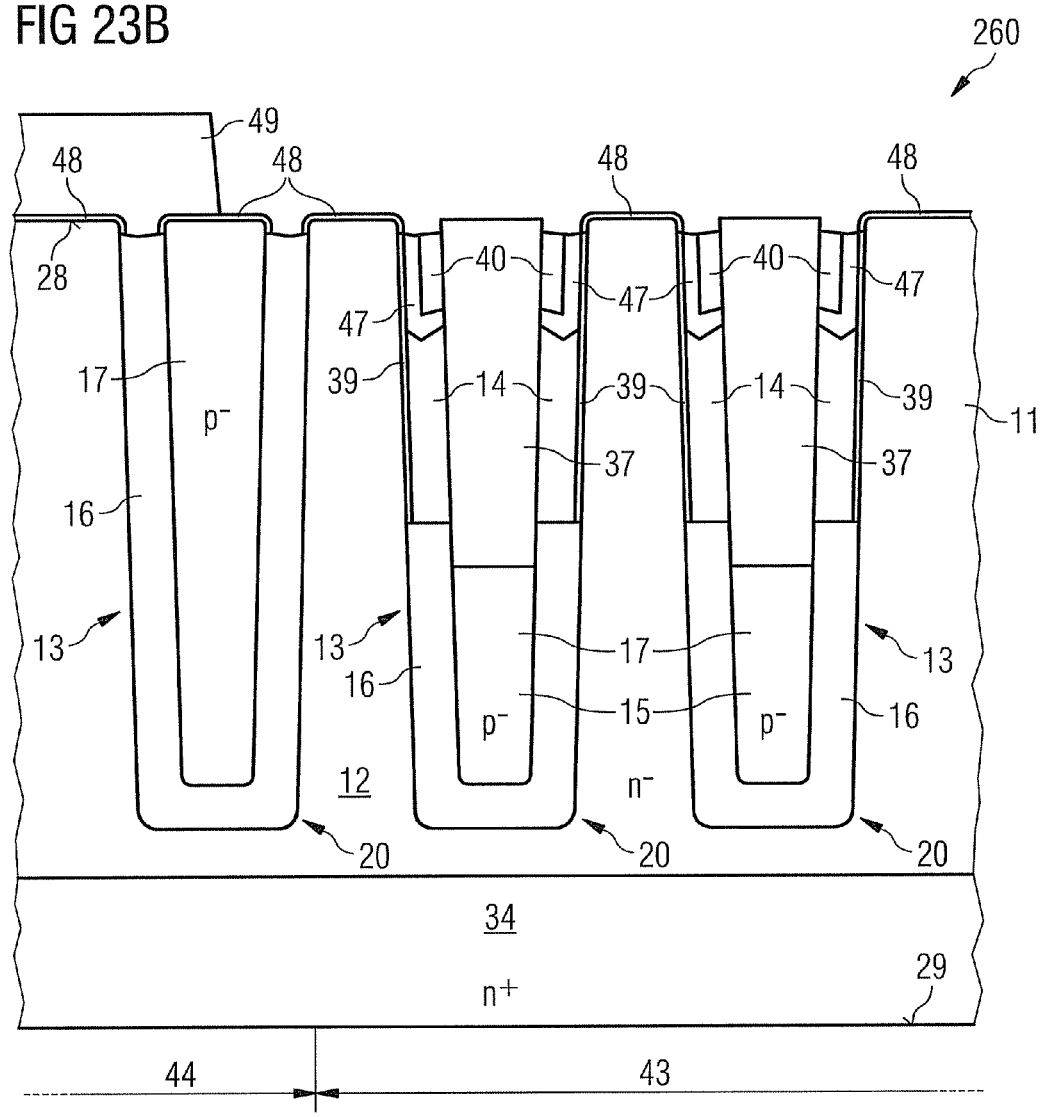

The dielectric material 16, the insulating layer 47 and the insulating layer 40 are subsequently partially removed for instance by etching and a further insulating layer 48 is produced on the first surface 28 and the exposed parts of the first semiconducting material 17 arranged in the edge region 44 for example by depositing an oxide or by an oxidation process. A photoresist mask 49 is then applied on parts of the first surface 28 and a first dopant material is subsequently implanted in a near-surface region of the semiconductor body 11 close to the first surface 28 in the active region 43. FIG. 23B illustrates the field effect transistor 260 after the above-mentioned process steps.

Figure 23C:
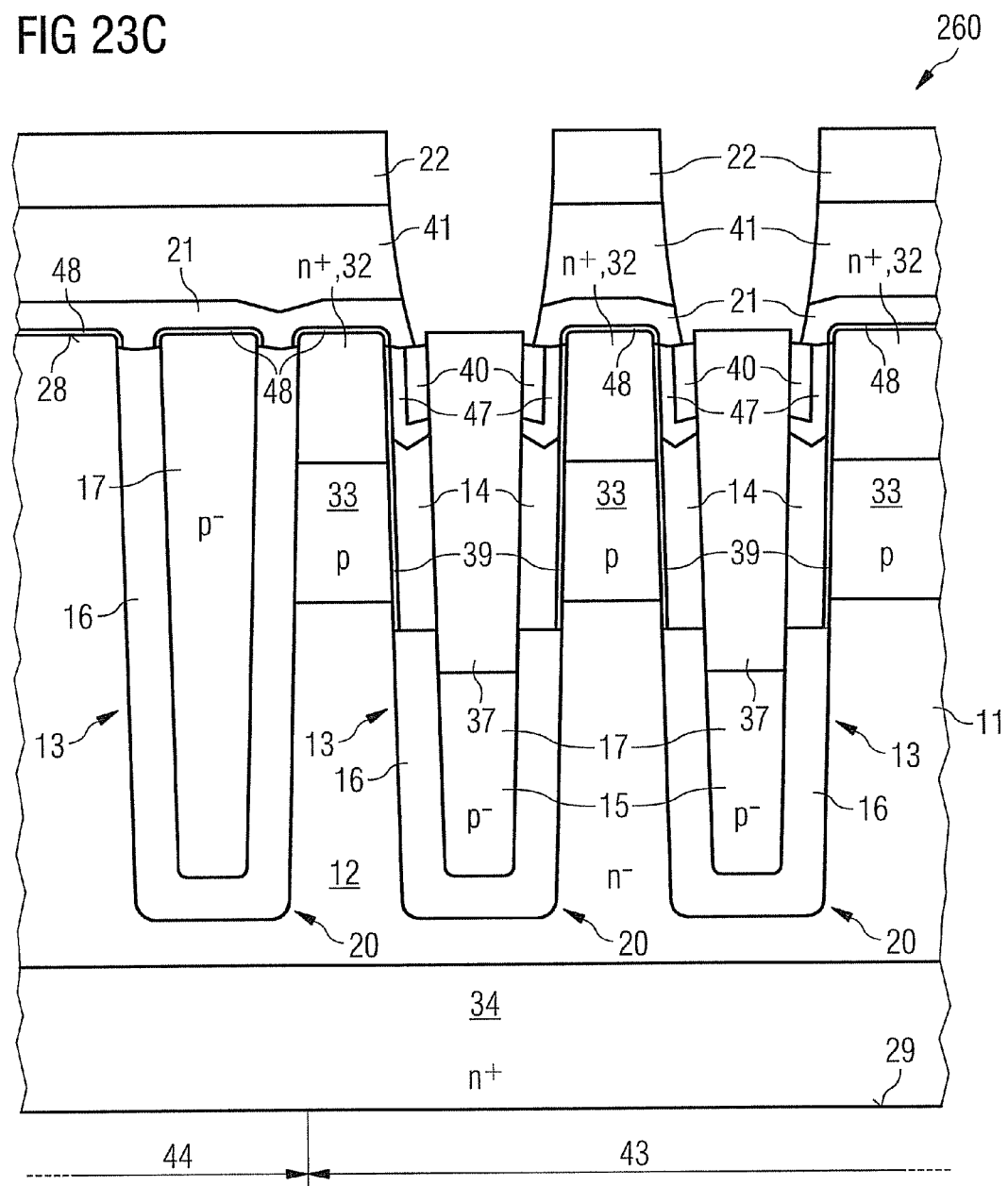

The photoresist mask 49 is removed and the first dopant material is driven in, thereby producing a p-doped body zone 33. Accordingly, a second dopant material is implanted in a near-surface region of the body zone 33 for instance by a masking technique and is subsequently driven in, thereby producing an n$^+$-doped source region 32. A layer 21, which for example contains an undoped silicate glass, is disposed at least partially on the first surface 28. On the layer 21, a further layer 41 is disposed, which for example contains a phosphorus silicate glass. Subsequently, a photoresist mask 22 is applied on the layer 41. The photoresist mask 22 contains openings for providing contact holes in the region of the trench 13 arranged in the active region 43. The contact holes are subsequently produced by an etching process. The field effect transistor 260 after the above-mentioned process steps is illustrated in FIG. 23C.

Figure 23D:
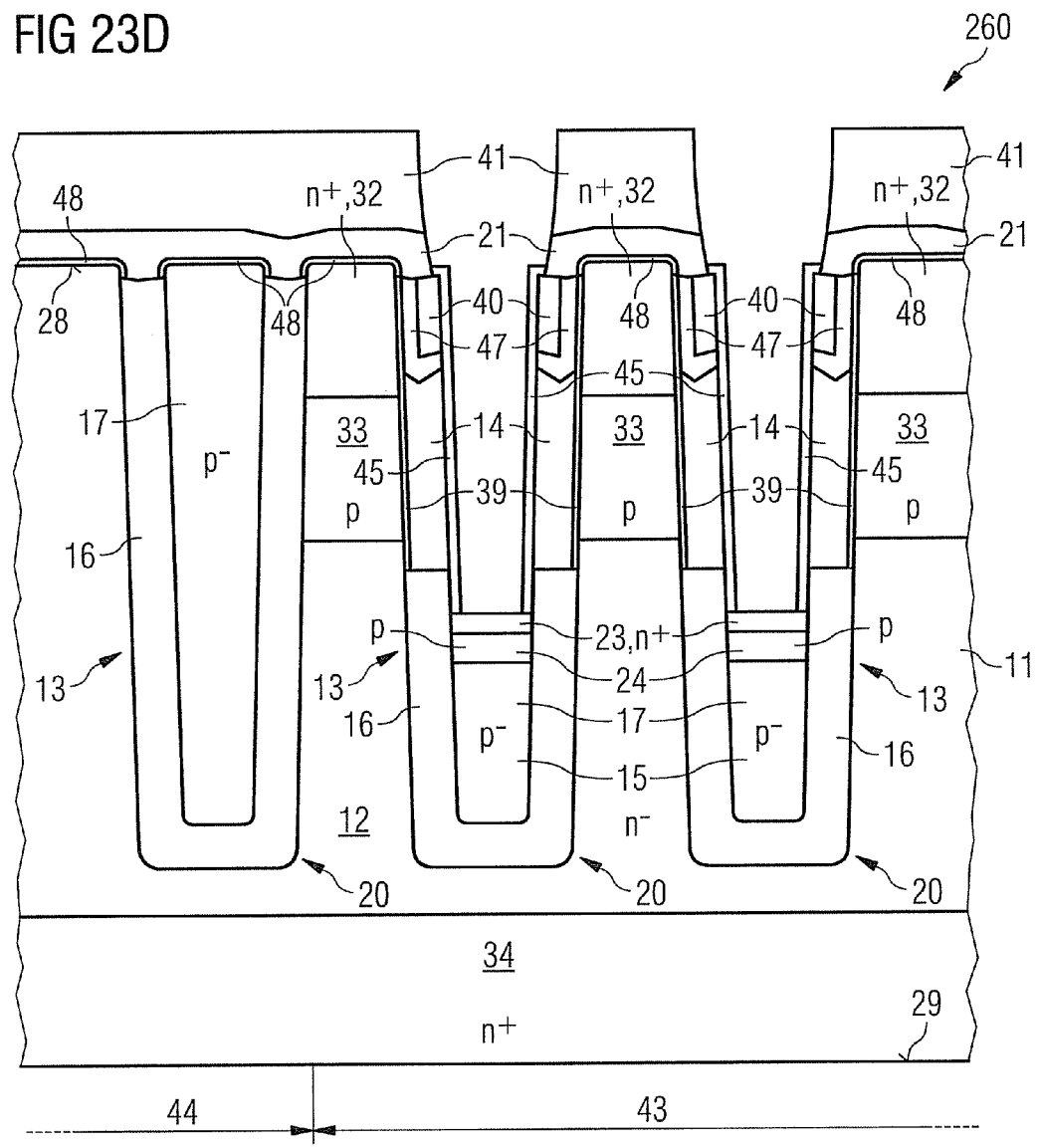

After the removal of the photoresist mask 22, the nitride 37 is completely removed in the trench 13, for instance by etching with hot phosphoric acid. In the trench 13, p-type dopants are implanted and then activated for example by rapid thermal processing (RTP) and subsequently, n-type dopants are implanted and activated in an analogue manner in the trench 13. Thereby, a region 24 of the first semiconducting material 17, which is higher doped than the rest of the first semiconducting material 17 and a second semiconducting material 23 of the field plate 15, which is of the same conductivity type as the drift region 12, are produced. In a further process step, an insulating layer 45, for example a TEOS layer, is deposited at least partially on the exposed parts of the trench 13. FIG. 23D illustrates the field effect transistor 260 after the above-mentioned process steps.

The second semiconducting material 23 and the region 24 are partially etched and contact holes extending partially into the source region 32 and the body zone 33 in the active region 43 and partially in the first semiconducting material 17 arranged in the edge region 44 are produced for example by an etching technique with the use of a photoresist mask 54, as illustrated in FIG. 23E.

Figure 23F:
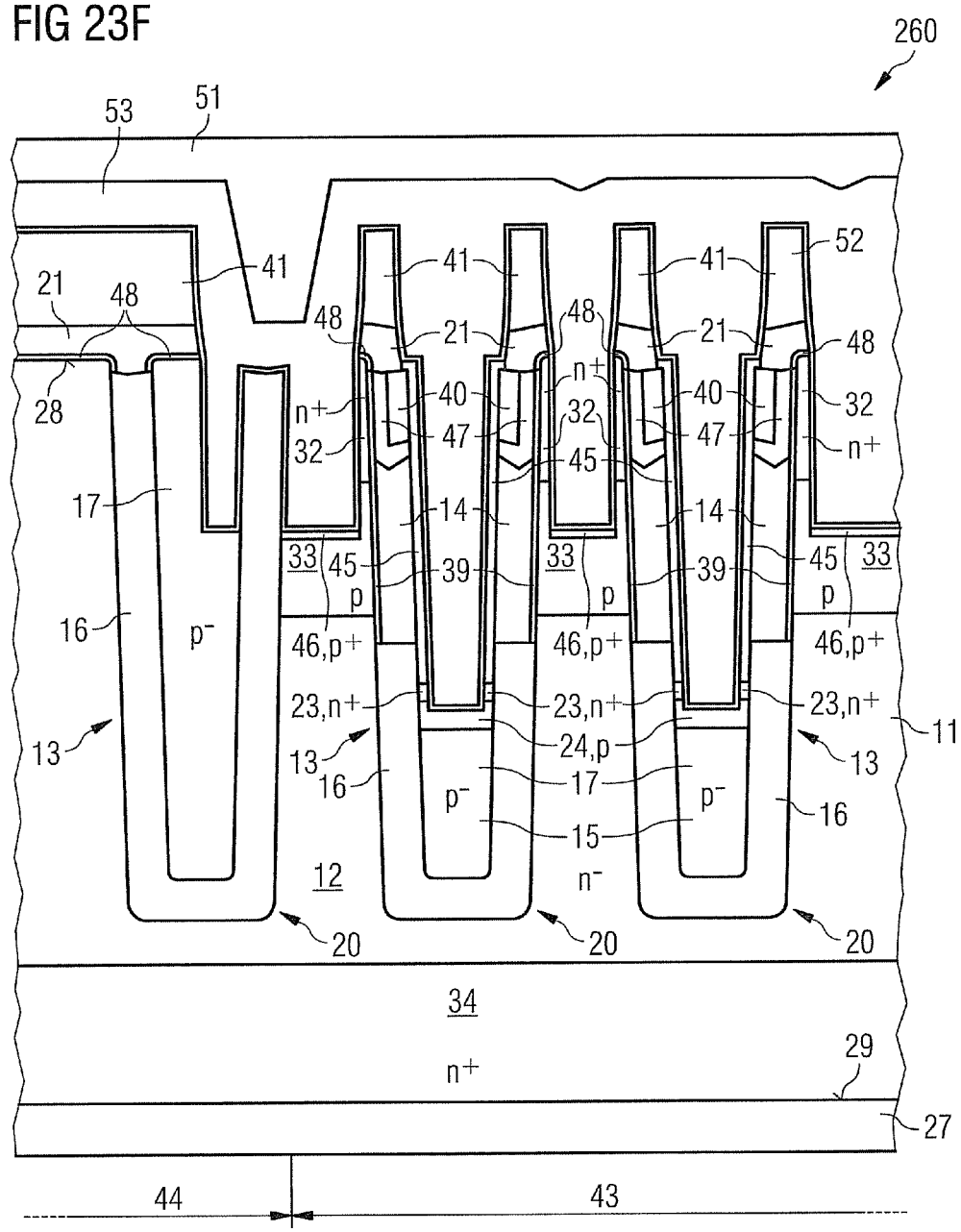

The photoresist mask 54 is subsequently removed. In further process steps, a p$^+$-doped region 46 is produced at least partially in a near-surface region of the body zone 33, for instance by implanting a dopant material and a subsequent rapid thermal processing (RTP), and an adhesive layer 52, for example containing Ti or TiN, is disposed both in the active region 43 and the edge region 44. Subsequently, a first electrode 26 is produced for instance by the deposition of at least one metal layer on the adhesive layer 52. In the illustrated embodiment, the first electrode 26 includes a first metal layer 53, which for example contains tungsten and is disposed on the adhesive layer 52, and a second metal layer 51, disposed on the first metal layer 53. Additionally, a second electrode 27 is produced on the second surface 29, for instance by disposing a metal. FIG. 23F illustrates the field effect transistor 260 after the above-mentioned process steps.

FIGS. 24A to 24D illustrate a method for the production of a field effect transistor 270. Components of the same function as those in the previous figures are identified by the same reference numbers and are not explained again below.

Figure 24A:
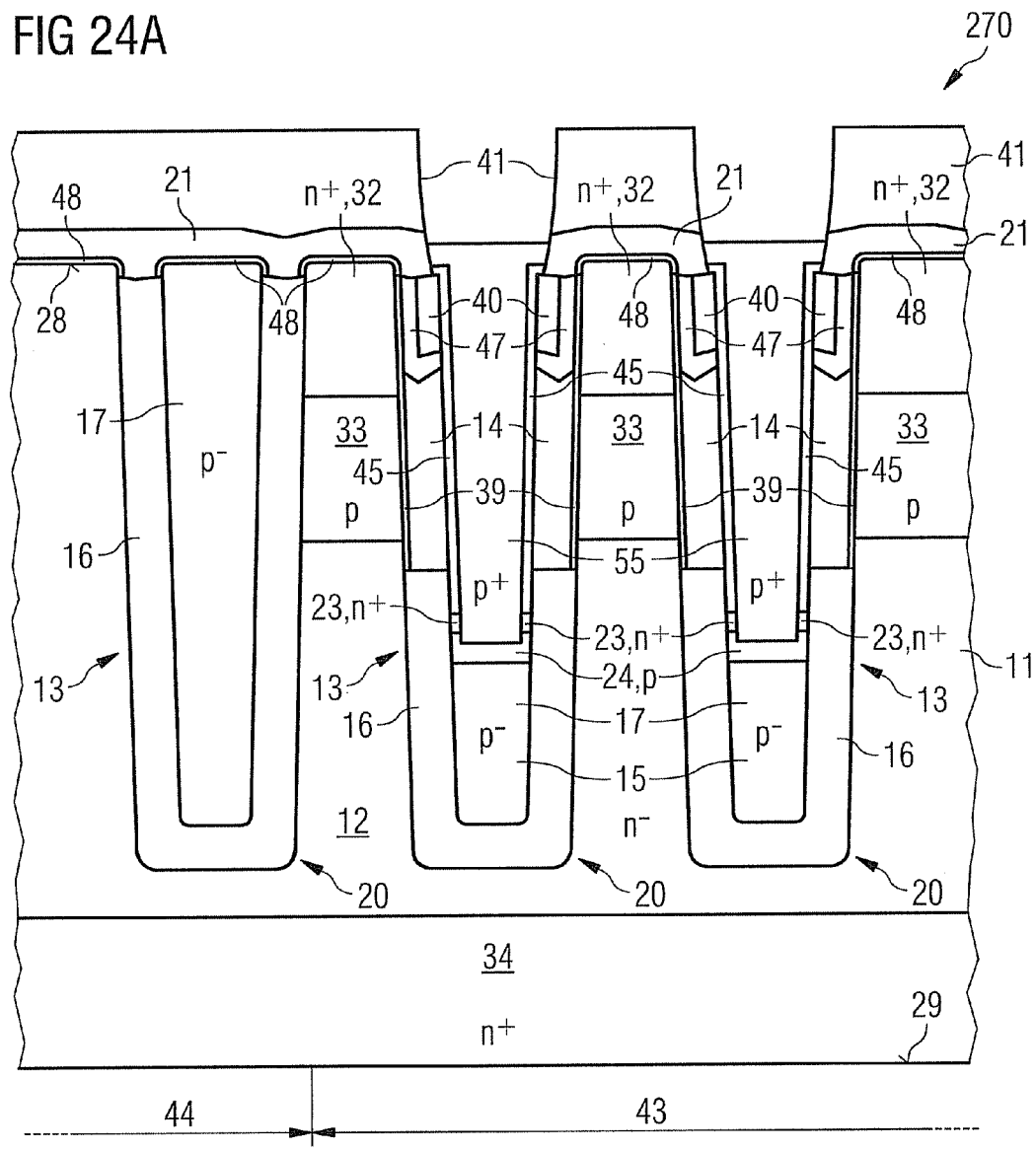
FIGS. 24A to 24D illustrate a method for the production of a field effect transistor.

The initial process steps for the production of the field effect transistor 270 may be the same as those for the production of the field effect transistors 250 and 260 illustrated in FIGS. 22A to 22E and 23A to 23D and are not listed again to avoid repetition. Subsequently, the second semiconducting material 23 and the region 24 are partially etched and a further semiconducting material 55, which in the illustrated embodiment is p$^+$-doped polysilicon, is deposited on the layer 41 and in the trench 13 arranged in the active region 43. In a further process step, the further semiconducting material 55 is recessed partially to essentially fill the trench 13 arranged in the active region 43. FIG. 24A illustrates the field effect transistor 270 after the above-mentioned process steps.

Figure 24B:
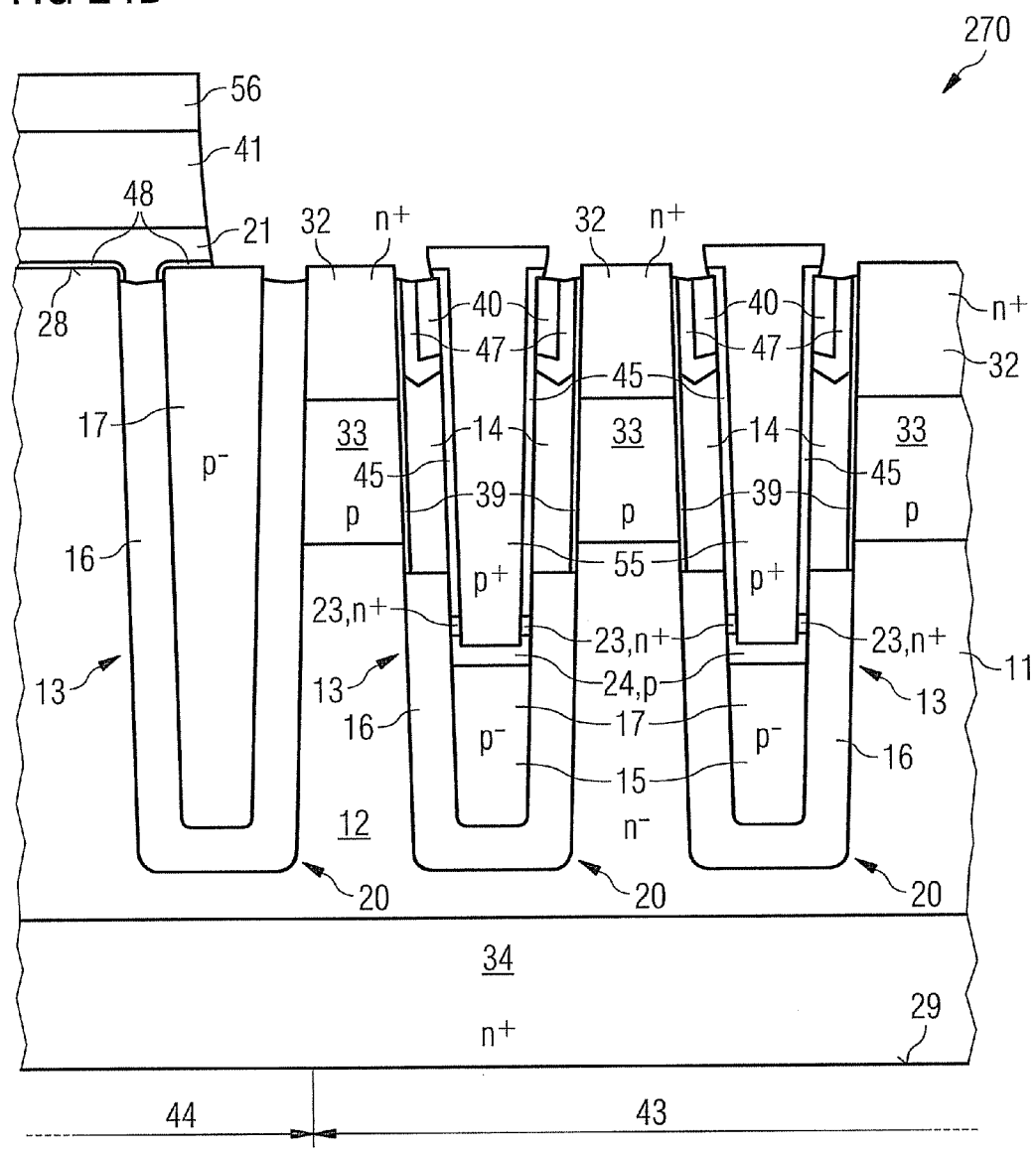

The layers 21, 41 and 48 are then removed in the active region 43, for example by masked lithography using the photoresist mask 56 as illustrated in FIG. 24B.

Figure 24C:
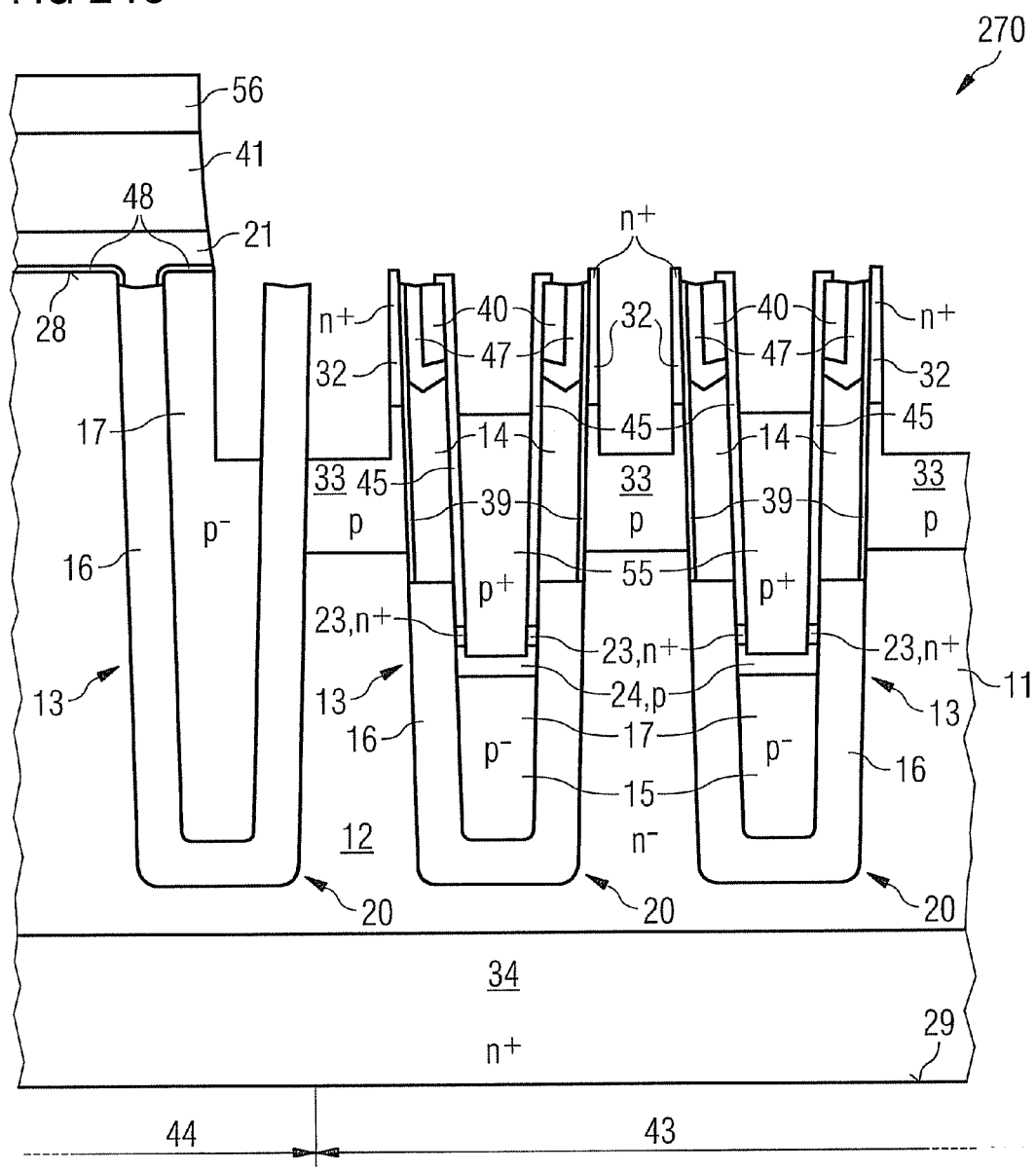

In a further process step, contact holes extending partially into the source region 32, the body zone 33 and the further semiconducting material 55 in the active region 43 and partially in the first semiconducting material 17 arranged in the edge region 44 are produced for example by etching as illustrated in FIG. 24C.

Figure 24D:
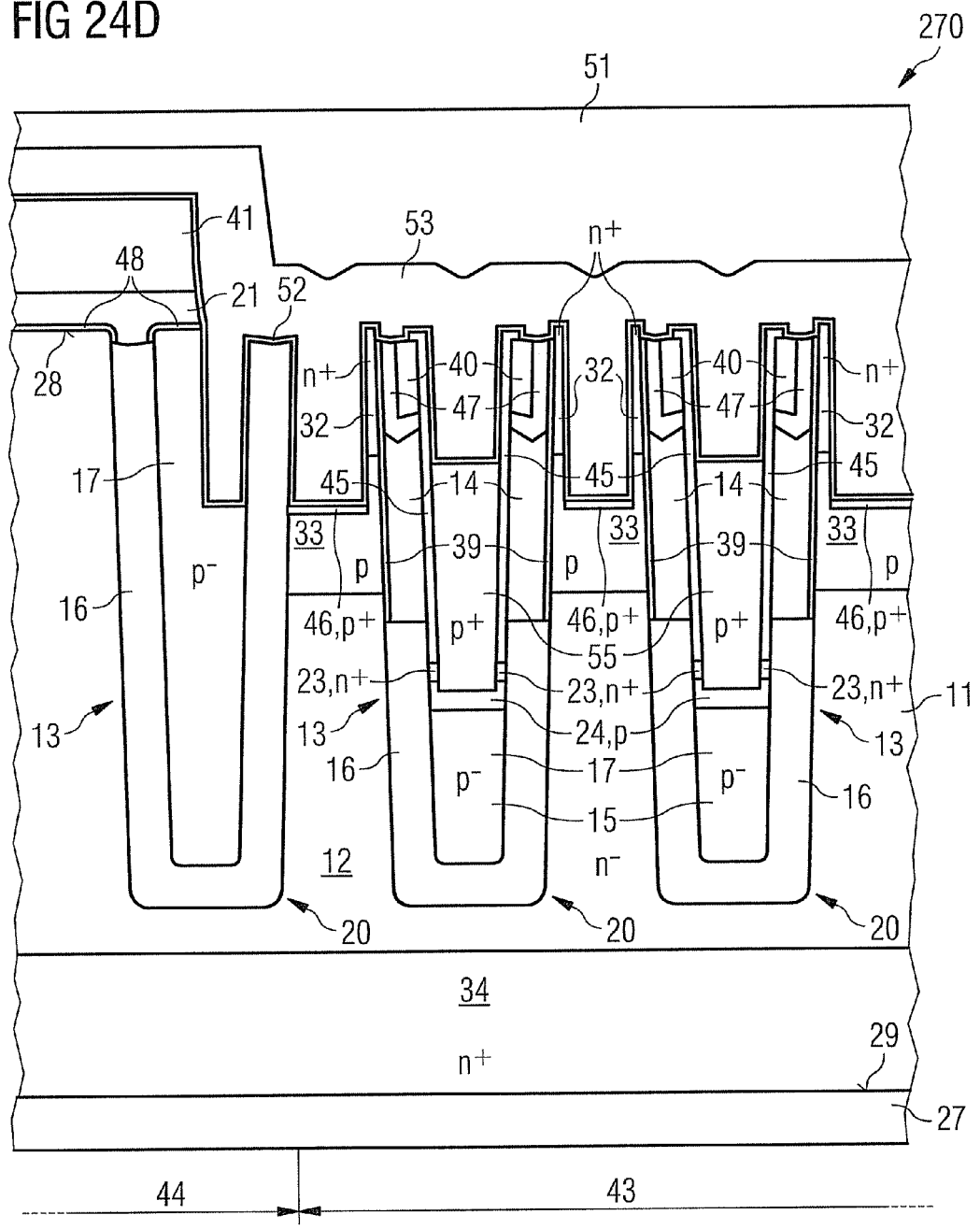

The photoresist mask 56 is subsequently removed. In further process steps, a p$^+$-doped region 46 is produced at least partially in a near-surface region of the body zone 33, for instance by implanting a dopant material and a subsequent rapid thermal processing (RTP), and an adhesive layer 52, for example containing Ti or TiN, is disposed both in the active region 43 and the edge region 44. Subsequently, a first electrode 26 is produced for instance by the deposition of at least one metal layer on the adhesive layer 52. In the illustrated embodiment, the first electrode 26 includes a first metal layer 53, which for example contains tungsten and is disposed on the adhesive layer 52, and a second metal layer 51, disposed on the first metal layer 53. Additionally, a second electrode 27 is produced on the second surface 29, for instance by disposing a metal. The field effect transistor 270 after the above-mentioned process steps is illustrated in FIG. 24D. FIGS. 25A to 25E illustrate a method for the production of a field effect transistor 280. Components of the same function as those in the previous figures are identified by the same reference numbers and are not explained again below.

Figure 25A:
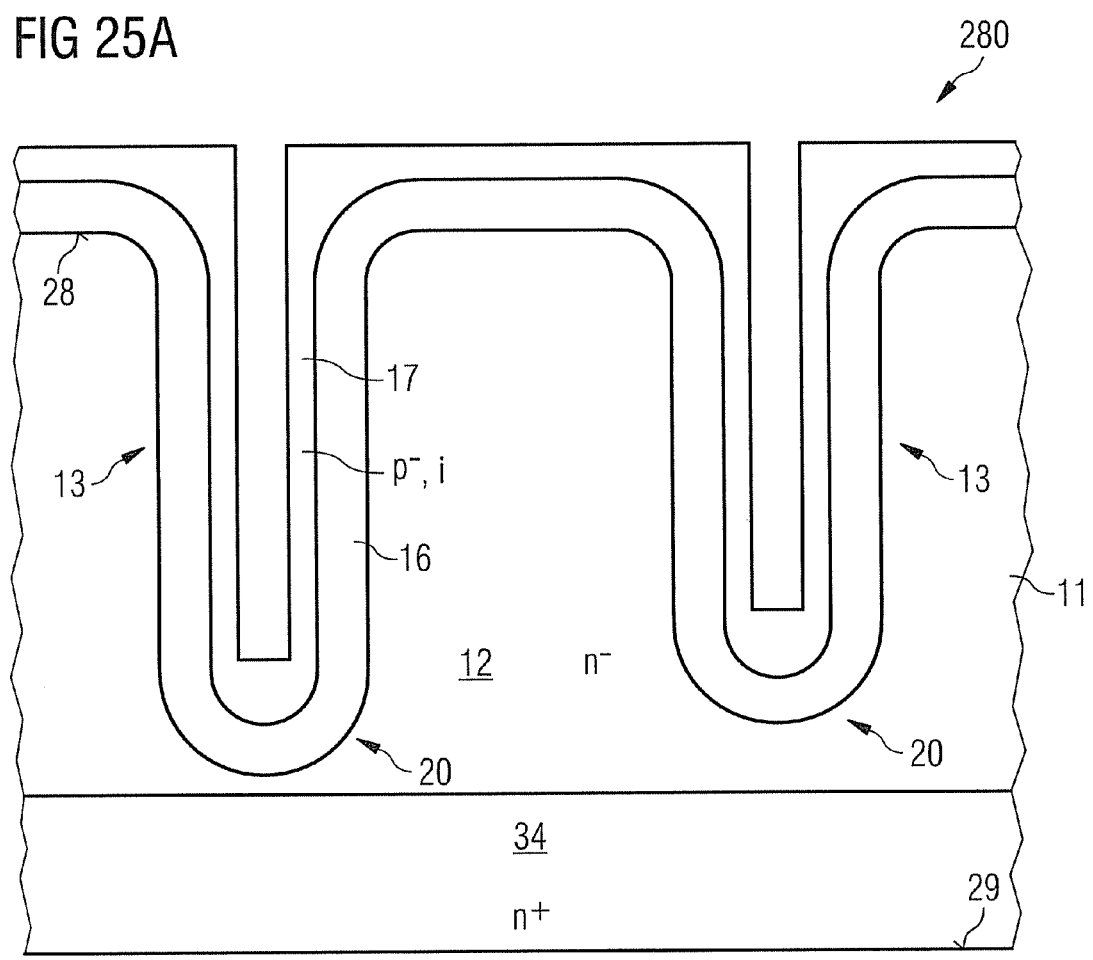

In an initial process step, a semiconductor body 11 of a first conductivity type, which is an n-type in the illustrated embodiment, having an n$^+$-doped region 34 in a near surface region of the second surface 29 of the semiconductor body 11, which in the illustrated embodiment is a back-sided surface, and an n$^-$-doped drift region 12 on the n$^+$-doped region 34 is provided. At least one trench 13 is formed in the drift region 12, for example by a masked etching process. A dielectric material 16, for example an oxide, is disposed at least partially on the first surface 28 of the semiconductor body 11 and the walls and the base 20 of the at least one trench 13. In a further process step, a first semiconducting material 17, which in the illustrated embodiment is lightly p-doped polysilicon or undoped polysilicon, is disposed on the dielectric material 16. FIG. 25A illustrates the field effect transistor 280 after the above-mentioned process steps.

Figure 25B:
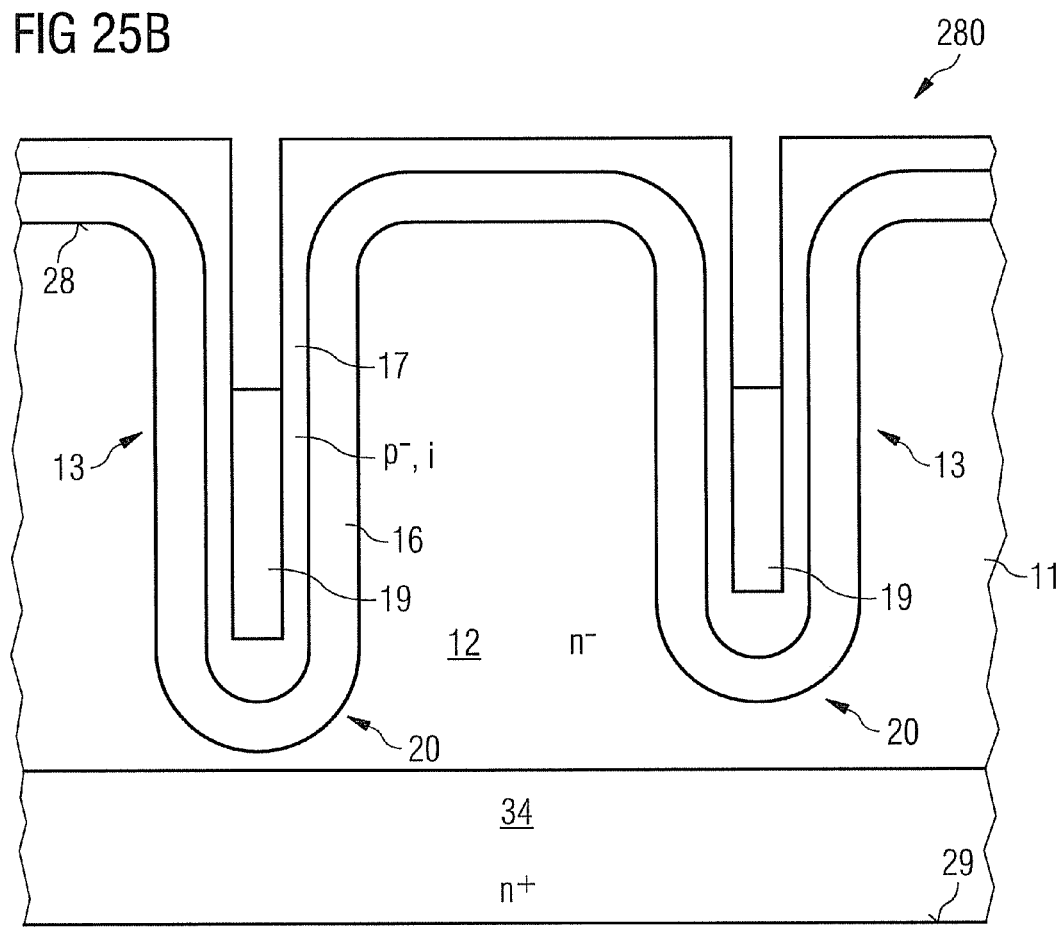

A metal 19, for instance gold, platinum or tungsten, or a silicide is disposed at least partially on the first semiconducting material 17. The metal 19 is then etched back to at least partially fill the trench 13, as illustrated in FIG. 25B.

Figure 25C:
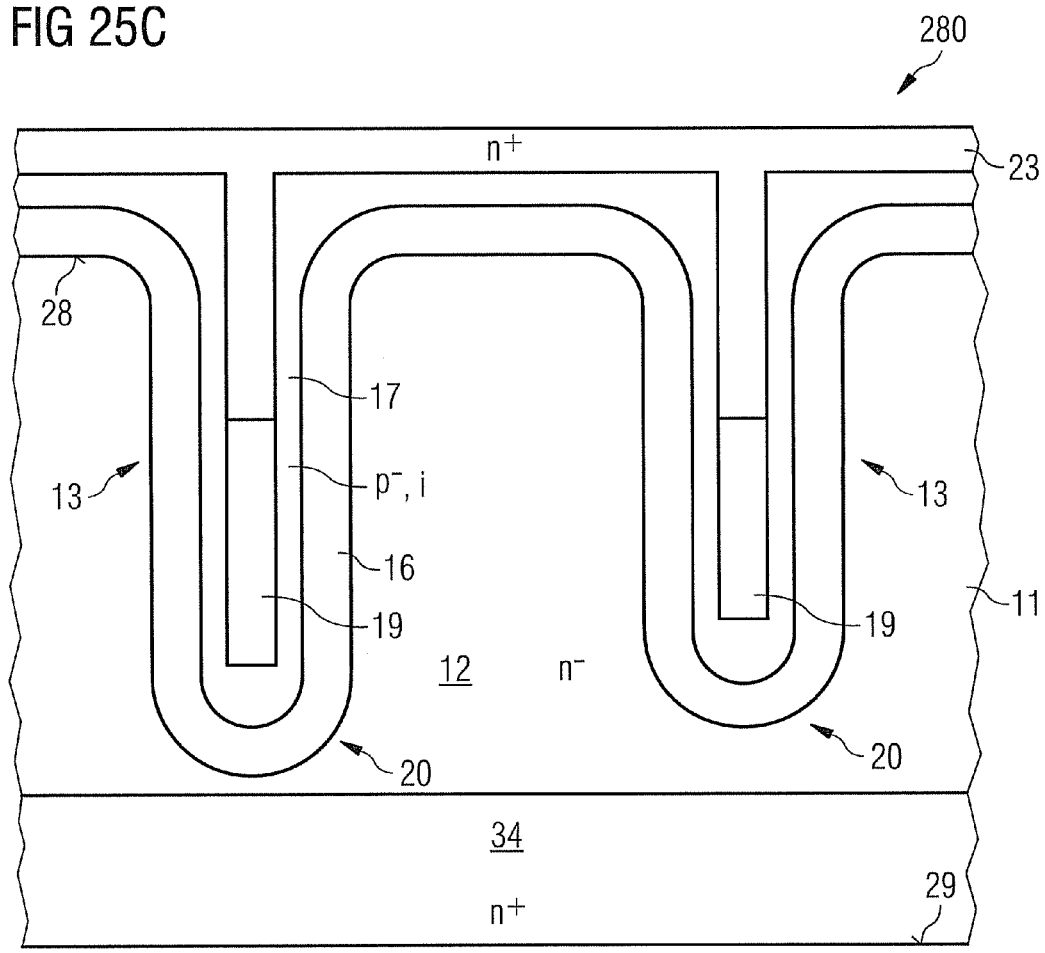

A second semiconducting material 23, which has the same conductivity type as the drift region 12, is deposited at least partially on the first semiconducting material 17 and the metal 19. The doping concentration of the second semiconducting material 23 is higher than the doping concentration of the first semiconducting material 17. The second semiconducting material 23 contains for instance highly doped polysilicon. FIG. 25C illustrates the field effect transistor 280 after the above-mentioned process steps.

In a further process step, the dopant of the second semiconducting material 23 is at least partially driven into the first semiconducting material 17. The second semiconducting material 23 is then at least partially etched back in an edge region 44 of the field effect transistor 280, the edge region 44 enclosing an active region 43 and extending to an edge of the semiconductor body 11. The field effect transistor 280 after the above-mentioned process steps is illustrated in FIG. 25D.

Figure 25E:
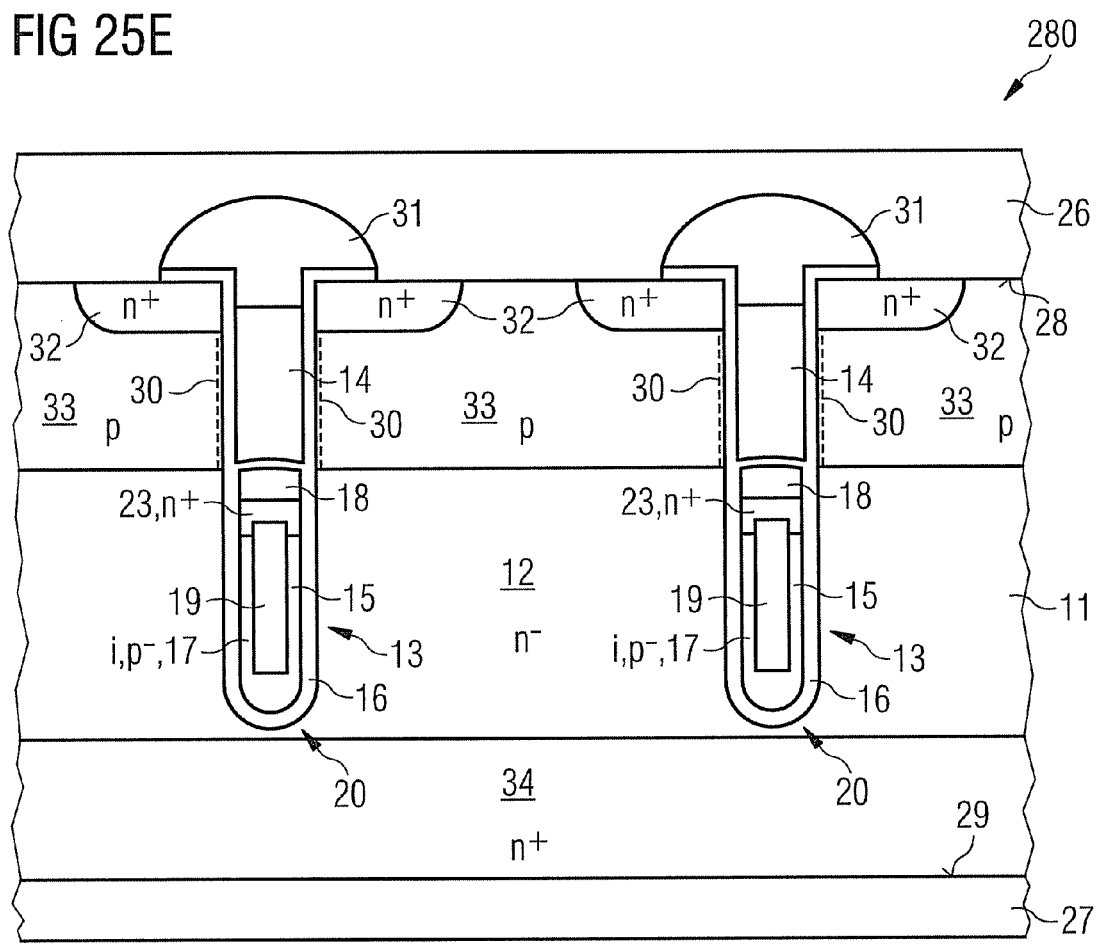

In further process step, a contact region 18 is produced adjacent to the second semiconducting material 23 in the trench 13 arranged in the active region 43 and a gate electrode 14 is provided in an upper portion of the trench 13 arranged in the active region 43, the gate electrode 14 being separated from the contact region 18 by the dielectric material 16. A p-doped body zone 33 and an n$^+$-doped source region 32 are produced in a near-surface region of the first surface 28 in the active region 43 the semiconductor body 11, for instance by masked implantation processes. Subsequently, an insulating region 31 is disposed at least partially on the gate electrode 14 and a first electrode 26 is produced on the first surface 28 and the insulating region 31, for example by the deposition of a metal. A second electrode 27 is produced on the second surface 29 in a similar way. FIG. 25E illustrates a section of the active region 43 of the field effect transistor 280 after the above-mentioned process steps.

In a non-illustrated embodiment, a tunneling layer 35 is produced at least partially around the metal 19.

In a further non-illustrated embodiment, a p or p$^+$-doped semiconducting material or an n or n$^+$-doped semiconducting material, for example polysilicon, is disposed at least partially in the trench 13 instead of the metal 19.

In FIGS. 22 to 25, methods for the production of field effect transistors 250 to 280 with a semiconductor device structure for at least one n-channel MOSFET are illustrated. In non-illustrated embodiments of the methods, the field effect transistors have a semiconductor device structure for at least one p-channel MOSFET. In this case, the doping of the individual regions of the p-channel MOSFET complements the doping of the corresponding regions of the n-channel MOSFET.

In further non-illustrated embodiments of the methods, the field effect transistors have a semiconductor device structure for at least one IGBT, which may be an n-channel IGBT or a p-channel IGBT.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a semiconductor body;
   a drift region of a first conductivity type;
   at least one trench extending into the drift region;
   at least one gate electrode;
   a field plate in at least a portion of the at least one trench, wherein the field plate comprises centers of recombination; and
   a dielectric material, wherein the dielectric material at least partially surrounds the gate electrode and the field plate;
   wherein the field plate comprises a first semiconducting material, wherein the first semiconducting material comprises a variable doping concentration, the variable doping concentration decreasing in a vertical direction towards a base of the at least one trench.

2. The semiconductor device of claim 1, wherein the at least one gate electrode is arranged in an upper portion of the at least one trench and the field plate is at least partially arranged in a lower portion of the at least one trench.

3. The semiconductor device of claim 1, wherein the first semiconducting material is at least partially of a second conductivity type, the second conductivity type being complementary to the first conductivity type.

4. The semiconductor device of claim 3, wherein the number of charge carriers of the first conductivity type in the drift region is essentially equal to the number of charge carriers of the second conductivity type in the first semiconducting material.

5. The semiconductor device of claim 1, wherein the field plate comprises a contact region, the contact region electrically coupling the field plate to a first electrode.

6. The semiconductor device of claim 5, wherein the contact region comprises one of a group comprising highly doped polysilicon, a silicide and a metal.

7. The semiconductor device of claim 1, wherein the first semiconducting material comprises one of group comprising a nitrided semiconducting material, and a lightly doped polysilicon.

8. The semiconductor device of claim 1, wherein the first semiconducting material comprises a stepped graded doping concentration, the stepped graded doping concentration decreasing in a vertical direction towards a base of the at least one trench.

9. The semiconductor device of claim 1, wherein the first semiconducting material comprises a Gaussian doping concentration in a vertical direction towards a base of the at least one trench.

10. The semiconductor device of claim 1, wherein a diffusion barrier layer is arranged at least partially between a region of the first semiconducting material and a rest of the first semiconducting material, which is lower doped than the region of the first semiconducting material.

11. The semiconductor device of claim 1 configured as a field effect transistor.

12. The semiconductor device of claim 1, wherein the field plate further comprises a metal.

13. The semiconductor device of claim 12, wherein the metal is selected from the group consisting of gold and platinum.

14. A semiconductor device comprising:
a semiconductor body;
a drift region of a first conductivity type;
at least one trench extending into the drift region;
at least one gate electrode;
a field plate in at least a portion of the at least one trench; and
a dielectric material, wherein the dielectric material at least partially surrounds the gate electrode and the field plate;
wherein the field plate comprises a first semiconducting material, wherein the first semiconducting material comprises a variable doping concentration, the variable doping concentration decreasing in a vertical direction towards a base of the at least one trench, wherein the first semiconducting material comprises a graded doping concentration, the graded doping concentration decreasing in a vertical direction towards a base of the at least one trench.

15. The semiconductor device of claim 14, wherein the field plate comprises centers of recombination.

16. A semiconductor device comprising:
a semiconductor body;
a drift region of a first conductivity type;
at least one trench extending into the drift region;
at least one gate electrode;
a field plate in at least a portion of the at least one trench; and
a dielectric material, wherein the dielectric material at least partially surrounds the gate electrode and the field plate;
wherein the field plate comprises a first semiconducting material, wherein the first semiconducting material comprises a variable doping concentration, the variable doping concentration decreasing in a vertical direction towards a base of the at least one trench, wherein the first semiconducting material comprises a linearly graded doping concentration, the linearly graded doping concentration decreasing in a vertical direction towards a base of the at least one trench.

17. A semiconductor device comprising:
a semiconductor body;
a drift region of a first conductivity type;
at least one trench extending into the drift region;
at least one gate electrode;
a field plate in at least a portion of the at least one trench; and
a dielectric material, wherein the dielectric material at least partially surrounds the gate electrode and the field plate;
wherein the field plate comprises a first semiconducting material, wherein the first semiconducting material comprises a variable doping concentration, the variable doping concentration decreasing in a vertical direction towards a base of the at least one trench, wherein the doping concentration of the first semiconducting material decreases with increasing distance to a first surface of the semiconductor body.

18. A semiconductor device comprising:
a semiconductor body;
a drift region of a first conductivity type;
at least one trench extending into the drift region;
at least one gate electrode;
a field plate in at least a portion of the at least one trench; and
a dielectric material, wherein the dielectric material at least partially surrounds the gate electrode and the field plate;
wherein the field plate comprises a first semiconducting material, wherein the first semiconducting material comprises a variable doping concentration, the variable doping concentration decreasing in a vertical direction towards a base of the at least one trench,
wherein the field plate further comprises a metal; and
wherein a further layer is arranged at least partially between the metal and the first semiconducting material.

19. A semiconductor device comprising:
a semiconductor body;
a drift region of a first conductivity type;
at least one trench extending into the drift region;
at least one gate electrode;
a field plate in at least a portion of the at least one trench, the field plate comprising a first semiconducting material that is at least partially of a second conductivity type, the second conductivity type that is complementary to the first conductivity type, wherein the first semiconducting material comprises a variable doping concentration, the variable doping concentration decreasing in a vertical direction towards a base of the at least one trench; and
a dielectric material at least partially surrounding the gate electrode and the field plate;
wherein the field plate further comprises a second semiconducting material of the first conductivity type, the second semiconducting material being arranged at least partially between the first semiconducting material and a contact region and adjacent to the contact region and comprising a doping concentration higher than a doping concentration of the first semiconducting material.

20. The semiconductor device of claim 19, wherein the second semiconducting material comprises highly doped polysilicon.

21. The semiconductor device of claim 19, wherein the field plate further comprises a diffusion barrier layer, the diffusion barrier layer being arranged at least partially between the first semiconducting material and the second semiconducting material.

22. The semiconductor device of claim 21, wherein the diffusion barrier layer comprises a material selected from the group consisting of oxides and nitrides.

* * * * *